US008269555B2

(12) United States Patent
van der Heijden et al.

(10) Patent No.: US 8,269,555 B2
(45) Date of Patent: Sep. 18, 2012

(54) EFFICIENT LINEAR LINC POWER AMPLIFIER

(75) Inventors: Mark Pieter van der Heijden, Den Bosch (NL); Antonius Johannes Matheus de Graaw, Haelen (NL); Jan Sophia Vromans, Maastricht (NL); Rik Jos, Nijimegen (NL)

(73) Assignee: NXP B.V., Eindhoven (NL)

( * ) Notice: Subject to any disclaimer, the term of this patent is extended or adjusted under 35 U.S.C. 154(b) by 103 days.

(21) Appl. No.: 12/989,890

(22) PCT Filed: Apr. 30, 2009

(86) PCT No.: PCT/IB2009/051756
§ 371 (c)(1),
(2), (4) Date: Oct. 27, 2010

(87) PCT Pub. No.: WO2009/136326
PCT Pub. Date: Nov. 12, 2009

(65) Prior Publication Data
US 2011/0051842 A1    Mar. 3, 2011

(30) Foreign Application Priority Data
May 5, 2008   (EP) ..................................... 08103825

(51) Int. Cl.
*H03F 3/68* (2006.01)
(52) U.S. Cl. ... 330/124 R; 330/10; 330/251; 330/207 A; 330/295
(58) Field of Classification Search .............. 330/124 R, 330/10, 251, 207 A, 295
See application file for complete search history.

(56) References Cited

U.S. PATENT DOCUMENTS

| | | | |
|---|---|---|---|
| 4,994,760 A * | 2/1991 | Roehrs | 330/295 |
| 5,345,189 A | 9/1994 | Hornak et al. | |
| 6,147,553 A | 11/2000 | Kolanek | |
| 6,359,513 B1 | 3/2002 | Kuo et al. | |
| 7,714,649 B1 * | 5/2010 | Cripe | 330/251 |
| 8,058,927 B2 * | 11/2011 | Potscher et al. | 330/10 |
| 2003/0112064 A1 | 6/2003 | Masuda et al. | |

(Continued)

FOREIGN PATENT DOCUMENTS
WO         03/047093 A1    6/2003

OTHER PUBLICATIONS

Cox, D. "Linear Amplification with Nonlinear Components," IEEE Trans. on Communications, pp. 1942-1945 (Dec. 1974).

(Continued)

*Primary Examiner* — Patricia Nguyen

(57) ABSTRACT

Method for setup of parameter values in a RF power amplifier circuit arrangement (200), wherein the amplifier circuit arrangement (200) comprises a first (210) and a second (220) amplification branch and is operated in an out-phasing configuration for amplification of RF input signals with modulated amplitude and modulated phase and respective circuit arrangements are disclosed. According to a first aspect a re-optimization of the dead-time or conversely the duty-cycle, respectively, the phase of the output signal after the combiner can be kept linear with respect to the out-phasing angle. Further, according to a second aspect, additionally to introduction of an optimally chosen dead-time, a non-coherent combiner (Lx, Lx*) can reduce crowbar current and switching losses due the output capacitance (Cds). Furthermore, according to a third aspect the reactive compensation can, additionally or alternatively, be controlled by operating both amplification branches at different duty-cycles.

14 Claims, 20 Drawing Sheets

U.S. PATENT DOCUMENTS

2006/0181345 A1    8/2006    Saed
2007/0040471 A1    2/2007    Ollila

OTHER PUBLICATIONS

Grebennikov, A. et al. "Class-E with Parallel Circuit—A New Challenge for High-Efficiency RF and Microwave Power Amplifiers," IEEE MTT-S Digest, vol. 3, pp. 1627-1630 (Jun. 2002).

Chireix, H. "High Power Outphasing Modulation," Proc. of the Institute of Radio Engineers, vol. 23, No. 11, pp. 1370-1392 (Nov. 1935).

Hamill, D. C. "Impedance Plane Analysis of Class DE Amplifier," IEE Electronics Letters, vol. 30, No. 23, pp. 1905-1906 (Nov. 1994).

Tarsia, M., et al "A Low Stress 20dBm Power Amplifier for LINC Transmission with 50% Peak PAE in 0.25μm CMOS," Proc. of IEEE ESSCIR, 4 pgs. (Sep. 2000).

Albuet, M. "RF Power Amplifiers," Noble Publishing Corp., title page, p. i, table of contents, pp. 254-255 (2001).

Crips, S. C. "RF Power Amplifiers for Wireless Communications," Chapter 8.4 (Chireix's Outphasing Amplifier, pp. 240-247 (2002).

Zhang, X., et al, "Design of Linear Outphasing Power Amplifiers", Artech House, pp. 145-157 (2003).

Hakala, I., et al. "A 2.14-GHz Chireix Outphasing Transmitter," IEEE Trans. on Microwave Theory and Techniques, vol. 53, No. 6, pp. 2129-2138 (Jun. 2005).

Modzelewski, J., et al. "Output Power Control in a Power Combiner with Class-DE Amplifiers," Proc. of the 2005 European Conf. on Circuit Theory and Design, vol. 3, No. 29, pp. 125-128 (Aug. 2005).

Demanuele, C., et al. "Issues on the Design of a Variable Power LINC Amplifier System in SiGe Operating at 2.4 GHz," $13^{th}$ IEEE Intl. Conf on Electronics, Circuits and Systems, pp. 439-442 (Dec. 2006).

Hung, T-P, et al. "CMOS Outphasing Class-D Power Amplifiers with Chireix Combiners," IEEE Microwave and Wireless Components Letters, vol. 17, No. 8, pp. 619-621 (Aug. 2007).

Tom, K. et al. "Load-Pull Analysis of Outphasing Class-E Power Amplifier," $2^{nd}$ Intl. Conf. on Wireless Broadband and Ultra Wideband Communications, 4 pages (2007).

Moloudi, S., et al "An Outphasing Power Amplifier for a Software-Defined Radio Transmitter," Solid-State Circuits Conf. 2008, paper 31.6, pp. 568-569, 636 (Feb. 2008).

International Search Report and Written Opinion for Int'l. Patent Appln. No. PCT/IB2009/051756 (Jul. 21, 2009).

* cited by examiner

EFFICIENT LINEAR LINC POWER AMPLIFIER

FIELD OF THE INVENTION

The invention concerns in general circuit topologies for out-phasing power amplifiers with improved efficiency, in particular a method for setup of a RF power amplifier circuit arrangement for amplification of RF input signals with modulated amplitude and modulated phase and respective RF power amplifier circuit arrangements.

BACKGROUND OF THE INVENTION

Mobile, in particular wireless communication is broadly used in several fields of applications, e.g. in the home, public or office area, as well as for any kind of communication, e.g. speech, data, and/or multi-media communication. Basically, these applications are confronted with two major problems.

First, the available bandwidth for transmitting information is limited due to the general shortage of available spectrum. Accordingly, it is well known to modulate both the amplitude and the phase of the carrier to reduce required bandwidth. For instance, systems, in which the amplitude and the phase are modulated, i.e. which process wide-band complex envelope signals, are EDGE, UMTS (WCDMA), HSxPA, WiMAX (OFDM) and 3G-LTE (OFDM). However, amplifying amplitude modulated carriers without distortion in the transmitter output stage imposes significant linearity constraints on the output stage amplifier.

Second, power efficiency of mobile transmitters is important, since mobile terminals in wireless communication are typical portable and thus, usually battery powered. In such mobile terminals, the output stage of the transmitter unit is the largest power consumer of the whole device. Consequently, any improvement in this stage with respect to power efficiency is important. Known efficient power amplifiers topologies or circuit arrangements are known class-C and class-E radio frequency (RF) amplifiers in which the output amplification devices, e.g. the transistors, conducts current only at the time when the collector-emitter voltage is at its lowest value. Unfortunately, class-C and class-E amplifiers are very nonlinear and introduce substantial distortion of the amplitude modulation. Accordingly, class-C and class-E amplifiers are used mainly in transmitters transmitting signals, which are only modulated in frequency, e.g. where the amplitude, i.e. the "envelope" of the RF carrier is constant. Hence, distortion of the amplitude has no negative effects.

Linear Amplification using Nonlinear Components (LINC) is a well-known concept for high efficient linear power amplification of RF signals. Detailed information may be gathered from S. C. Crips, "Advanced Techniques in RF Power Amplifiers Design", Artech House 2002, or from D. C. Cox in "Linear Amplification with Nonlinear Components", IEEE Transactions on Communications, December 1974, pp. 1942-1945.

The LINC concept, also known as out-phasing, is illustrated by means of the simplified out-phasing power amplifier 100 in FIG. 1a. Accordingly, an amplitude and phase modulated RF signal $S_{in}(t)$ is split in two RF signals $S_1(t)$ and $S_2(t)$ each being phase modulated and having constant amplitude:

$$S_{in}(t) = A(t)\sin(\omega t + \varphi(t)) \quad (1)$$

$$S_1(t) = \frac{1}{2}\sin(\omega t + \varphi(t) + \psi(t)) \quad (2)$$

$$S_2(t) = \frac{1}{2}\sin(\omega t + \varphi(t) - \psi(t)) \quad (3)$$

$$\psi(t) = \arccos(A(t)) \quad (4)$$

Then, the signals $S_1(t)$ and $S_2(t)$, having constant amplitudes, can be separately amplified by means of efficient non-linear saturated power amplifiers (PA) RF PA1 and RF PA2 in amplification branches 110, 120. After the amplification, the output RF signal is reconstructed by means of a signal component combiner. The output signal of the combiner equals the sum (or difference) of the two input signals $S_1(t)$ and $S_2(t)$:

$$S_{out} = S'_1(t) + S'_2(t) = G\cos(\Psi(t))\sin(\omega t + \phi(t)) = GA(t)\sin(\omega t + \phi(t)) \quad (5),$$

where G represents the gain of the amplification stages, i.e. the power amplifiers RF PA1 and RF PA2.

Ideally voltage sources are to be combined so that the average current in the amplification devices can vary as function of the out-phasing angle $\Psi(t)$. If ideal class-A, class-B or class-C operation is used, the devices act as current sources and the DC current does not vary with the out-phasing angle, meaning that the efficiency will drop linearly with output power, i.e. class-A like. However, in overdriven or saturated class-A, class-B or class-C operation modes, the amplification devices act more as voltage sources. That is, approximately independent of input drive and output current and the DC current is able to vary with the out-phasing angle. Ideally the efficiency will drop according to the square root of output power, i.e. class-B like. So effectively there is no gain in power efficiency compared to a linear class-B PA design.

This afore-mentioned behavior can be explained by the so-called load-pulling effect that one amplifier has on the other. FIG. 1b illustrates, on the right hand side, a simplified equivalent circuit for a differential output signal combiner connected to a saturated power amplifier that is approximated as a set of two voltage generators. The equivalent circuit shows that the reconstruction of the amplitude modulation is accomplished by modulation of the effective load impedance of the amplifiers as function of the out-phasing angle $\Psi(t)$. Accordingly, the load impedance is complex, except for the situation of minimum and maximum output power at $\Psi=0°$ and $\Psi=90°$. The reactive part of the impedance causes an increase in circulating RF currents, which reduce the efficiency of the combiner and cause the class-B like power efficiency.

It is known that the efficiency may be improved by means of the so-called Chireix output combining technique, which has been described in H. Chireix, "High power out phasing modulation", Proceedings of the Institute of Radio Engineers (Proc. IRE), vol. 23, no. 11, pp. 1370-1392, November 1935. Basically, Chireix's approach compensates for the reactive part of the effective load impedance by means of fixed compensating reactances, which are connected in parallel to the load as illustrated in FIG. 1c. However practically is it quite difficult to successfully implement the Chireix concept, since in order to make it successful, the input power has to be modulated according to the amplitude modulation (AM) to keep the PA in saturation or the compensation reactances have to be changed dynamically.

U.S. Pat. No. 5,345,189 discloses a circuit for combining first and second signals having the same frequency for use in a high efficiency RF amplification stage wherein the circuit comprises basically only reactive circuit elements and thus, appears to be a resistive load. The first and second signals have a relative phase shift and the circuit generates an output signal proportional to the sum or difference of signals. In one embodiment, the circuit comprises a transformer and two LC circuits in which the capacitance is varied in response to relative phase shift.

Another way to improve the efficiency of a PA is to use true switching-mode amplifiers, i.e. class-D, class-E, class-DE, or class-F operation. From switching-mode amplifiers, the voltage-mode class-D (VMCD) PA comes close to an ideal voltage source and is believed to be suitable for the out-phasing concept. It is noted that VMCD is intended to also mean a single-ended or push-pull class-F type PA, since a class-F PA has similar voltage and current waveforms at the PA output. Several examples have been reported in literature according to the general schematic shown in FIG. 1d from X. Zhang, L. E. Larson and P. M. Asbeck, "Design of Linear Out-phasing Power Amplifiers", pp. 145-159, Artech House, 2003. FIG. 1d depicts a CMOS implementation of a class-D out-phasing amplifier with transmission line coupler.

A problem associated with this approach is that when using a regular class-D design in combination with a non-coherent Chireix combiner, the problem of the crowbar current, i.e. DC-switching current, and the switching losses due the output capacitance in a class-D amplifier remain unsolved.

M. Tarsia, J. Khoury and V. Boccuzzi, in "A Low Stress 20 dBm Power Amplifier for LINC Transmission with 50% Peak PAE in 0.25 um CMOS," Proc. 2000 IEEE ESSCIR, pp. 61-64, September 2000 show a class-D PA with adequate dead-time, i.e. a class-DE PA, to eliminate the crow-bar current and overcome the switching losses of the output capacitance. FIG. 1e shows the PA configuration and FIG. 1f shows how two of these PAs are to be used in an out-phasing configuration using a combiner circuit without Chireix components.

A problem with this approach is that when the class-DE PA is optimized as a separate component for optimum zero-voltage switching as proposed by D. C. Hamill, in "Impedance Plane Analysis of Class-DE Amplifier," IEE Electronics Letters, vol. 30, no. 23, pp. 1905-1906, November 1994, the design parameters are not necessarily optimal for operating this PA in an out-phasing configuration. It was found with simulation that the phase of the output signal after the combiner becomes non-linear with respect to the out-phasing angle, which does not occur when using a traditional class-D design with a duty-cycle of 50%.

SUMMARY OF THE INVENTION

Accordingly, it is an object of the present invention to provide a circuit arrangement and a respective method for improved linear power amplification of RF signals with high efficiency, in particular for input RF signals which are modulated in amplitude and phase, such as in transmitters for systems in which wide-band complex envelope signals.

The afore-mentioned object is achieved by a method in accordance with the appended claim 1.

Accordingly, for setting up a RF power amplifier circuit arrangement for amplification of RF input signals with modulated amplitude and modulated phase, wherein the circuit comprises first and second amplification branches each having an input and an output, for amplifying one of a first and a second component signal of which only the phase is modulated, and a combination of which corresponding to the RF input signal, wherein in each of the first and second amplification branches, respective first and second amplification devices are configured to operate in a switching-mode with a respective duty-cycle, and wherein a combination circuit is configured to combine the outputs of the first and second amplification branches such that the circuit arrangement is arranged for operating in an out-phasing configuration, the method comprises: setting values of first and second reactive inductive components of the combination circuit connected to respective first and second amplification device outputs of the respective first and second amplification devices, in accordance with the criteria of zero-voltage switching for each of the first and second amplification devices as a separate component; and adjusting the first and second duty-cycles for operating the first and second switching-mode amplification devices in accordance with the criteria of a constant phase of the output signal of the circuit arrangement with respect to the out-phasing angle of the out-phasing configuration by sweeping the out-phasing angle for different duty-cycles, and monitoring phase and efficiency as function of the out-phasing angle.

In a further development the method further comprises configuring the combination circuit as a non-coherent combiner by having first and second reactive inductive components of the combination circuit with different values. Alternatively, the value of an additional, third reactive element connected parallel to one of the first and second amplification device outputs may be adapted such that the combination circuit is configured for non-coherent combining. The required effective values of the first and second reactive inductive components can be found by sweeping the out-phasing angle for different duty-cycles and values for the third reactive element, and choosing the best efficiency as function of out-phasing angle for given output power back-off level. As a further alternative, the method comprises setting of a respective first and second duty-cycle for the respective first and second amplification devices to different values by sweeping the out-phasing angle for different duty-cycles.

The afore-mentioned object is further achieved by a RF power amplifier circuit arrangement for amplification of RF input signals with modulated amplitude and modulated phase in accordance with the appended claim 5.

Accordingly, the circuit arrangement comprises: first and second amplification branches each having an input and an output and being configured for amplifying one of a first and a second component signals of which only the phase is modulated, a combination of which corresponding to the RF input signal; in each of the first and second amplification branches, respective first and second amplification devices configured to be operative in a switching-mode, wherein each amplification branch having a respective first and second duty-cycle; wherein the outputs of the first and second amplification branches are combined by a combination circuit such that the circuit arrangement is operative in an out-phasing configuration; wherein respective first and second reactive inductive components are connected to the respective output of the first and second amplification devices; and wherein the first and second duty-cycles for operating the first and second switching-mode amplification devices are different.

The afore-mentioned object is further achieved by a RF power amplifier circuit arrangement for amplification of RF input signals with modulated amplitude and modulated phase in accordance with the appended claim 6.

Accordingly, the circuit arrangement comprises: wherein the circuit comprises first and second amplification branches each having an input and an output, for amplifying one of a first and a second component signals of which only the phase is modulated, and a combination of which corresponding to the RF input signal; wherein in each of the first and second amplification branches, respective first and second amplification devices are configured to operate in a switching-mode with a respective first and second duty-cycle; and wherein a combination circuit is configured to combine the outputs of the first and second amplification branches such that operating the circuit arrangement in an out-phasing configuration; wherein the values of first and second reactive inductive components of the combination circuit connected to respective first and second amplification device outputs of the respective first and second amplification devices, and the first and second duty-cycles for operating the first and second switching-mode amplification devices are obtained by a method in accordance with claim 1.

In a further development, the combination circuit may be configured as a non-coherent combiner by having first and second reactive inductive components of the combination circuit with different values. Alternatively, a third reactive element can be connected in parallel to one of the first and second amplification device outputs. The value of the duty-cycles and the value of the effective values of the first and second reactive inductive components are obtainable by a method in accordance with claim 2.

The first and second amplification devices may comprise a circuit configuration operative as switching-mode power amplifiers in one of class-D, class-DE, class-E, class-F, or class-E/F mode.

In a certain embodiment of the circuit arrangement, the combination circuit comprises a transmission-line transformer for combining the outputs of the first and second amplification branches. Alternatively, the combination circuit may comprise a centre-tapped differential inductor for combining the outputs of the first and second amplification branches. Yet alternatively, the combination circuit may comprise a λ/4-transmission line combiner for combining the outputs of the first and second amplification branches. Still in another alternative configuration, the combination circuit may comprise respective first and second transformers, of which a respective primary winding is connected with the respective outputs of the first and second amplification branches and the respective secondary windings are stacked in series for combining the outputs of the first and second amplification branches. Moreover, in yet a further alternative embodiment, the combination circuit may comprise a respective first and second lattice balun, of which the respective inputs are connected to the respective outputs of the first and second amplification branches and the outputs of the first and second lattice balun are connected in parallel to the load. In this context, a balun, is to be noted that a BALUN basically means a passive electronic circuit for converting between BALanced and UNbalanced electrical signals.

The circuit arrangement according to the invention is particular suitable for a system in which wide-band complex envelope signals are processed. In particular in transmitters for connectivity and cellular applications, where the modulation standards with high PAR require the power amplifier to be efficient over a large dynamic range to save on the battery life time. Examples for such systems may be Enhanced Data rates for GSM (Global System for Mobile communications) Evolution (EDGE), Universal Mobile Telecommunications System (UMTS) using Wideband Code Division Multiple Access (W-CDMA) modulation, High-Speed Packet Access in the Uplink or Downlink (HsxPA), Worldwide Interoperability for Microwave Access (WiMAX) using Orthogonal Frequency-Division Multiple Access (OFDM) modulation, and third generation Long Term Evolution (3G-LTE) using OFDM modulation or alike. It goes without saying that the afore-mentioned standards are only named as illustrative examples and thus, it is not intended to limit the in present invention thereon.

Summarizing, according to a first aspect of the invention, it has been found that by a re-optimization of the dead-time or conversely the duty-cycle, respectively, the phase of the output signal after the combiner can be kept linear with respect to the out-phasing angle. Moreover, the reactive components can be kept un-changed, i.e. the component values that are found when. e.g. the class-DE, amplifier is optimized as a separate amplifier, as proposed e.g. in D. C. Hamill, "Impedance Plane Analysis of Class-DE Amplifier," IEE Electronics Letters, vol. 30, no. 23, pp. 1905-1906, November 1994. In other words, it has been found that re-optimizing the dead time, e.g. of a class-DE amplifier, leads to constant phase of the output signal with respect to the out-phasing angle. The optimization of the duty-cycle can be done by sweeping the out-phasing angle for different duty-cycles, and monitoring phase and efficiency as function of out-phasing angle. It has been found that this results in one unique solution.

Further, according to a second aspect of the invention, it has been found that when additionally to introduction of an optimally chosen dead-time, e.g. when operating the amplifier in class-DE mode, a non-coherent combiner, e.g. a Chireix combiner, is used also the crowbar current and the switching losses due the output capacitance of the amplifier can be reduced. Such a combination achieves good power efficiency as function of out-phasing angle. The optimization of the duty-cycle and the value of the additional reactive element for the non-coherent combiner can be done by sweeping the out-phasing angle for different duty-cycles and values for the reactive element for the non-coherent combiner, and choosing the best efficiency as function of out-phasing angle for given a output power back-off level that is determined by the standard. As mentioned above, instead of using a separate parallel reactive element to make the paths electrically asymmetric, different parallel inductors Lx and Lx* may be used in both paths, i.e. instead of a combination of the inductor Lx with an additional reactive element B1 an inductor Lx* with the equivalent value is employed. This saves on one additional component and essentially does the same thing.

Furthermore, according to a third aspect of the invention it has been found that by means of changing the switching duty-cycle, controlling of the phase of the output signal in a high-efficiency switching mode amplifier, e.g. a class-DE and/or class-E operation mode, is possible. By this basic effect, generally discussed in M. Albulet, *RF Power Amplifiers*, Chapter 4, Noble Publishing. Atlanta, Ga., 2001, it can be reasoned that the reactive compensation can be controlled by operating both the amplifiers at different duty-cycles. This can be seen as a kind of 'digital Chireix' approach. The optimization of the duty-cycles of the amplifiers of each amplification branch can be done similar to the first and second aspect, but instead of using a reactive element for forming a non-coherent combiner, different duty cycles in the amplification branches are used.

It goes without saying that those skilled in the art recognize that the three aspects of the invention may be combined as applicable.

Lastly, the used amplifier configuration, in class-D, class-DE, class-E, class-F, or class-E/F mode, is preferably implemented by using a parallel-connected reactive (inductive) component as e.g. proposed by A. V. Grebennikov, in "Class-E with Parallel Circuit—A New Challenge for High-Efficiency RF and Microwave Power Amplifiers," IEEE MTT-S Digest, vol. 3. pp. 1627-1630, June 2002 for which the power efficiency may be optimized. It is noted that this is opposed to the more traditional way of using a series-connected reactive (inductive) component, which leads to a limited bandwidth of the amplifier.

Preferred embodiments and further developments of the invention are defined in the dependent claims of the independent claims. It shall be understood that the circuit arrangement of the invention and the method have similar and/or identical preferred embodiments as defined in the dependent claims thereof.

BRIEF DESCRIPTION OF THE DRAWINGS

These and other aspects of the invention will be apparent from and elucidated with reference to the embodiment(s) described hereinafter. In the following drawings the figures are schematically drawn and not true to scale, and identical reference numerals in different figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION OF EMBODIMENTS

Figure 2:
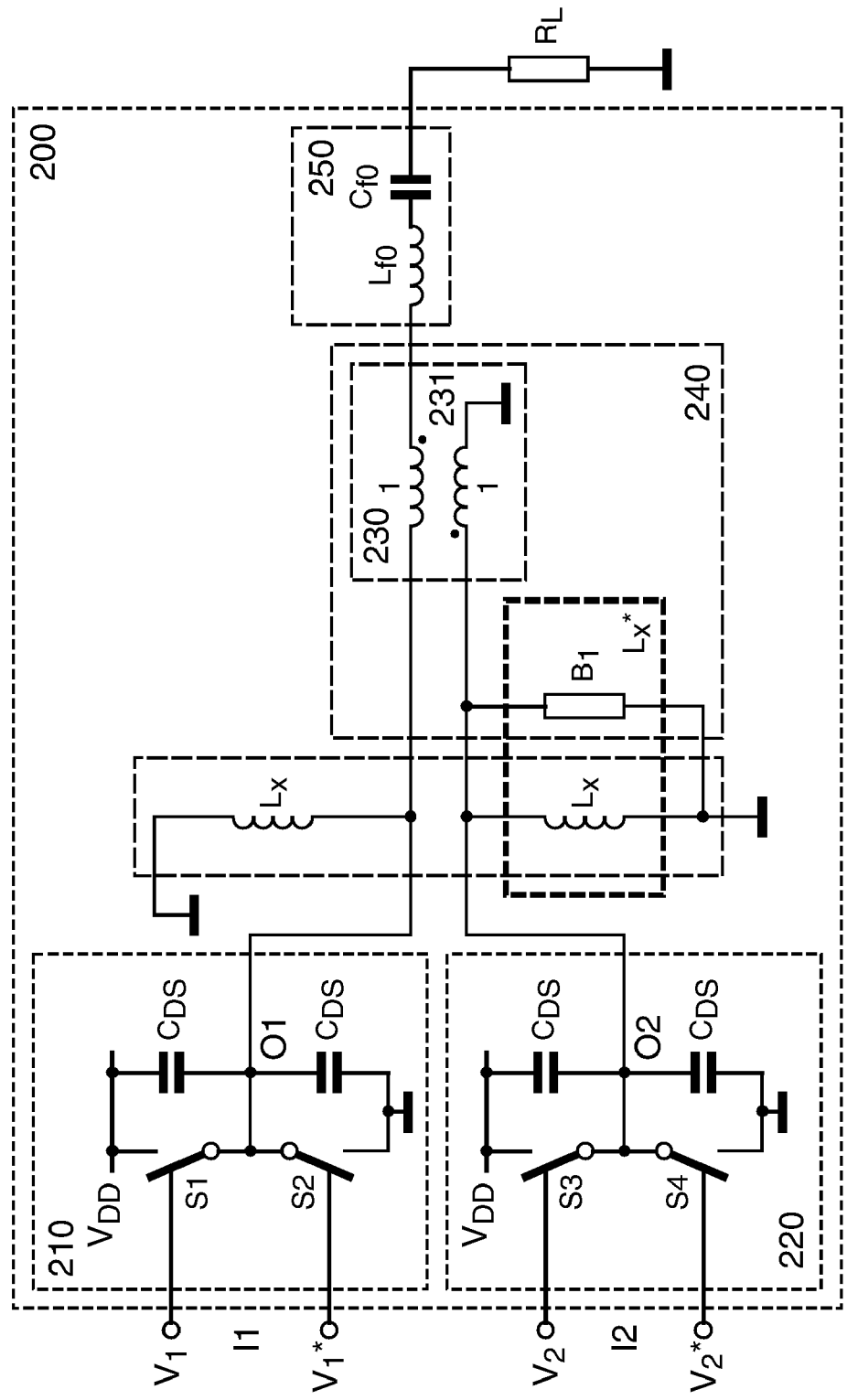
FIG. 2 shows a first basic out-phasing switch-mode PA implementation of the present invention.
Figure 3:
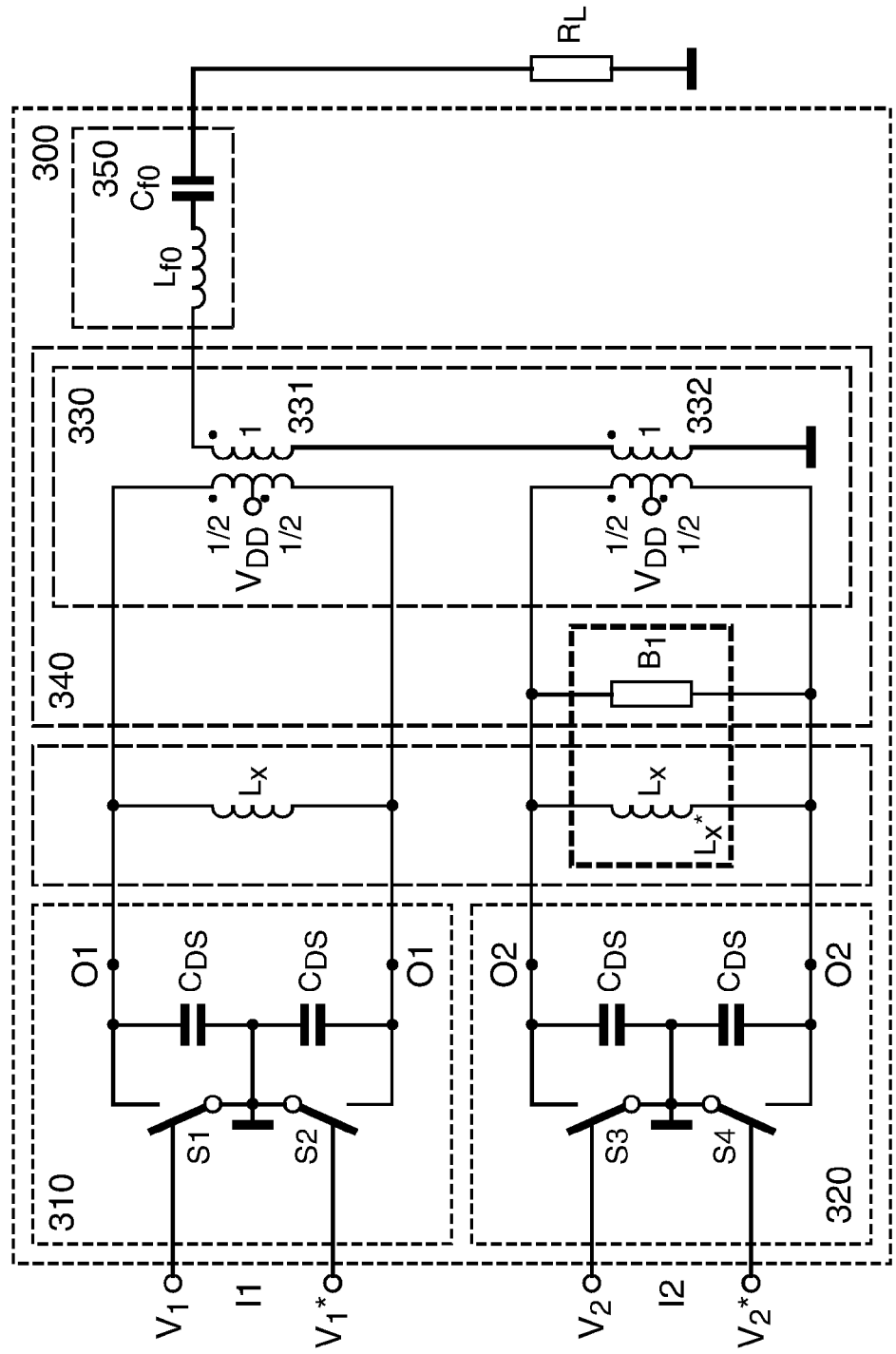
FIG. 3 shows second basic out-phasing switch-mode PA implementation of the present invention.
Figure 4:
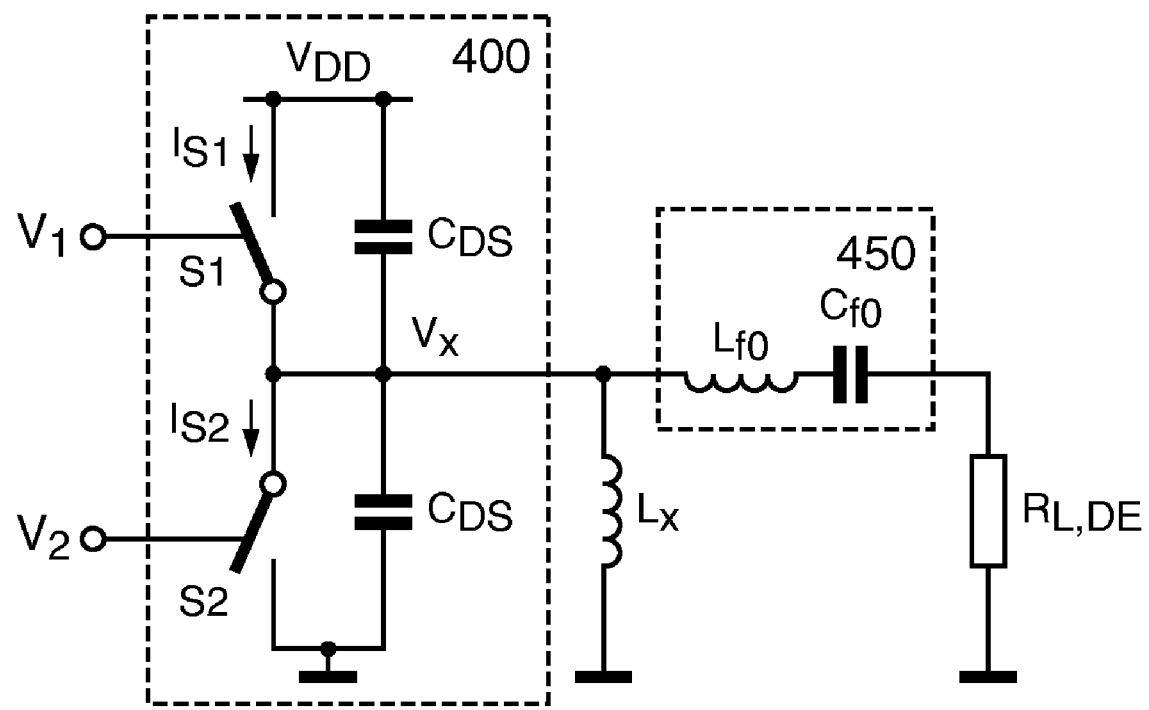
FIG. 4 shows an example of a 2.4 GHz parallel-tuned class-DE power amplifier circuit with a duty-cycle of 25%.

Two basic out-phasing switch-mode PA implementations are shown in FIG. 2 and FIG. 3, where features of the presented solution are indicated. FIG. 4 is an example for a parallel-tuned class-DE power amplifier (PA), which may be one amplification branch of the two amplification branches for a PA in an out-phasing configuration. As discussed above, linear amplification using non-linear components (LINC), also named out-phasing amplifier technique, where two signals of constant amplitude but of varying phase, also referred to as "phasor fragments", are amplified in two separate amplifiers, herein referred to as "branch amplifiers" in respective "amplification branches", and combined to create a single signal with varying phase and amplitude. Thus, when the phasor fragments are in-phase, the envelope power achieves its maximum.

It goes without saying that the FIGS. 2 to 4 only focus on elements which are required for describing and understanding of the principles of the invention. Accordingly, for a person skilled in the art it should be clear that for a practical implementation the respective circuit arrangements are to be realized by known circuit technology and elements as well, which is considered as standard design task.

The circuit arrangement 200 shown in FIG. 2 in general is based on a complementary class-DE PA implementation, which is used here only for the purpose of illustration, whilst it is not intended to restrict the invention thereto. The respective amplification devices operated in switching mode are represented in a simplified manner as switches S1, S2, S3, S4, which may be transistor devices or any other equivalent semiconductor device. Respective capacitances corresponding to the drain-source capacitor are indicated as capacitors $C_{DS}$. At the respective output O1, O2 of each amplification branch 210, 220 are connect in parallel inductor elements Lx which are for setting the required load-angle and together with the specific duty-cycle for zero-voltage switching. A lossless combiner 230 acting as a signal summer, e.g. in form of a transmission line transformer having a magnetic coupling coefficient of close to one (1), is used for combining the output signals of each amplification branch 210, 220. The primary winding of the transformer 231 is connected with one output O2 of one amplification branch 220 and further connected to ground of the circuit. The secondary winding of the transformer 231 is connected with the respective other output O1 of the other amplification branch 210 and via a series resonator tank 250 comprised of $L_{f0}$ and $C_{f0}$, to the respective load $R_L$.

The circuit arrangement 300 shown in FIG. 3 is based on a push-pull transformer-coupled class-DE implementation, which is used here only for the purpose of illustration, whilst it is not intended to restrict the invention thereto. The respective amplification devices operated in switching mode are again represent in a simplified manner as switches S1, S2, S3, S4 with respective capacitances corresponding to the drain-source capacitor indicated as capacitors $C_{DS}$. At the respective output O1, O2 of each amplification branch 310, 320 are connect in parallel inductor elements $L_x$ for setting the required class-DE load-angle and together with the specific duty-cycle for zero-voltage switching. As lossless combiner 330 for summing the output signals of the amplification branches 310, 320 is achieved by respective transmission line transformers 331, 332 having a magnetic coupling coefficient of close to 1. Middle tapped primary winding of each transformer 331, 332 is parallel connected to the respective inductor Lx setting the load-angle. The respective secondary windings of the transformers 331, 332 are connected in series via a series resonator tank 350 comprised of $L_{f0}$ and $C_{f0}$, to the respective load $R_L$.

Various novel combiner topologies can be deduced from the basic implementations of FIGS. 2 and 3 and will be described later as further embodiments. In this connection, it should be noted that the herein used term 'loss-less combiner' in connections with all embodiments described and illustrated in the Figures is assumed to fulfill the general requirement of summing the two voltage signals coherently. In accordance with the second aspect of the invention a respective non-coherent combiner can be made by reactively loading of one of the two branches.

However, it will be appreciated by those skilled in the art that instead of using a parallel-connected reactive element for making the combiner paths electrically asymmetric, also a different parallel inductor Lx in both combiner paths can be used. This saves one additional component and essentially achieves the same since adding a reactive element to one of the inductor elements Lx effectively changes the total parallel inductance (Lx*).

Accordingly, for purpose of illustration, the configuration of the circuits shown in FIGS. 2 and 3 can be further extended in accordance with the second aspect of the present invention by connecting a reactive element B1 to one of the amplification branches 210, 220 or 310, 320, respectively, or making the amplification branches asymmetric by having different inductors Lx and Lx*, respectively, for both branches. This results in that the combiner 230 or 330, respectively, becomes a non-coherent lossless combiner 240 or 340, respectively, by which the overall power efficiency versus the out-phasing angle can be further improved.

Now with respect to FIG. 4, for better illustration by way of an example a 2.4 GHz parallel-tuned class-DE power amplifier (PA) circuit 400 operated with a duty-cycle of 25% will be described, as a point to start from. The class-DE PA 400 is a good compromise in terms of power capability and maximum class-DE frequency of operation. As only non-idealities are taken $R_{ON}$ and $C_{DS}$ of the switch devices S1, S2, which in practice will be semiconductor switching elements, e.g. NMOS, PMOS or CMOS transistors realized in a known and applicable semiconductor technology.

For the example to be discussed, the assumed values are based on a 2-mm ED (Extended Drain) GO2 NMOS device in C065 that operates from a supply voltage $V_{DD}$=5V. Accordingly, this gives approximately a resistance, when the transistor is switched on, of $R_{ON}$=0.5 Ohm and a drain-source capacitance of $C_{DS}$=2 pF. The following design equations (6) to (10) can be used as a starting point for the parallel-tuned class-DE PA, where d represents the set duty-cycle of the class-DE amplifier.

$$R_{L,DE} = \frac{1}{2\pi\omega_0 C_{DS}} \frac{1 - \cos(2\varphi) + 2\varphi(\varphi - \sin(2\varphi))}{1 - \cos(2\varphi)} \quad (6)$$

$$L_x = \frac{1}{2\pi\omega_0 C_{DS}} \frac{1 - \cos(2\varphi) + 2\varphi(\varphi - \sin(2\varphi))}{2\varphi - \sin(2\varphi)} \quad (7)$$

$$\omega_0 = 2\pi f_0 = \frac{1}{\sqrt{L_{f0} c_{f0}}} \quad (8)$$

$$\varphi = \pi(1 - 2d) \quad (9)$$

$$P_{out} = \omega C_{DS} V_{DD}^2 \frac{\tan^2(d\pi)}{\pi} \quad (10)$$

Accordingly, for the assumed duty-cycle d=0.25 (0.25%), the equations (6) to (10), above, define for the load $R_{L,DE}$=18.3Ω and for the load-angle setting inductors $L_x$=772 pH and for the output power $P_{out}$=23.8 dBm.

Figure 5:
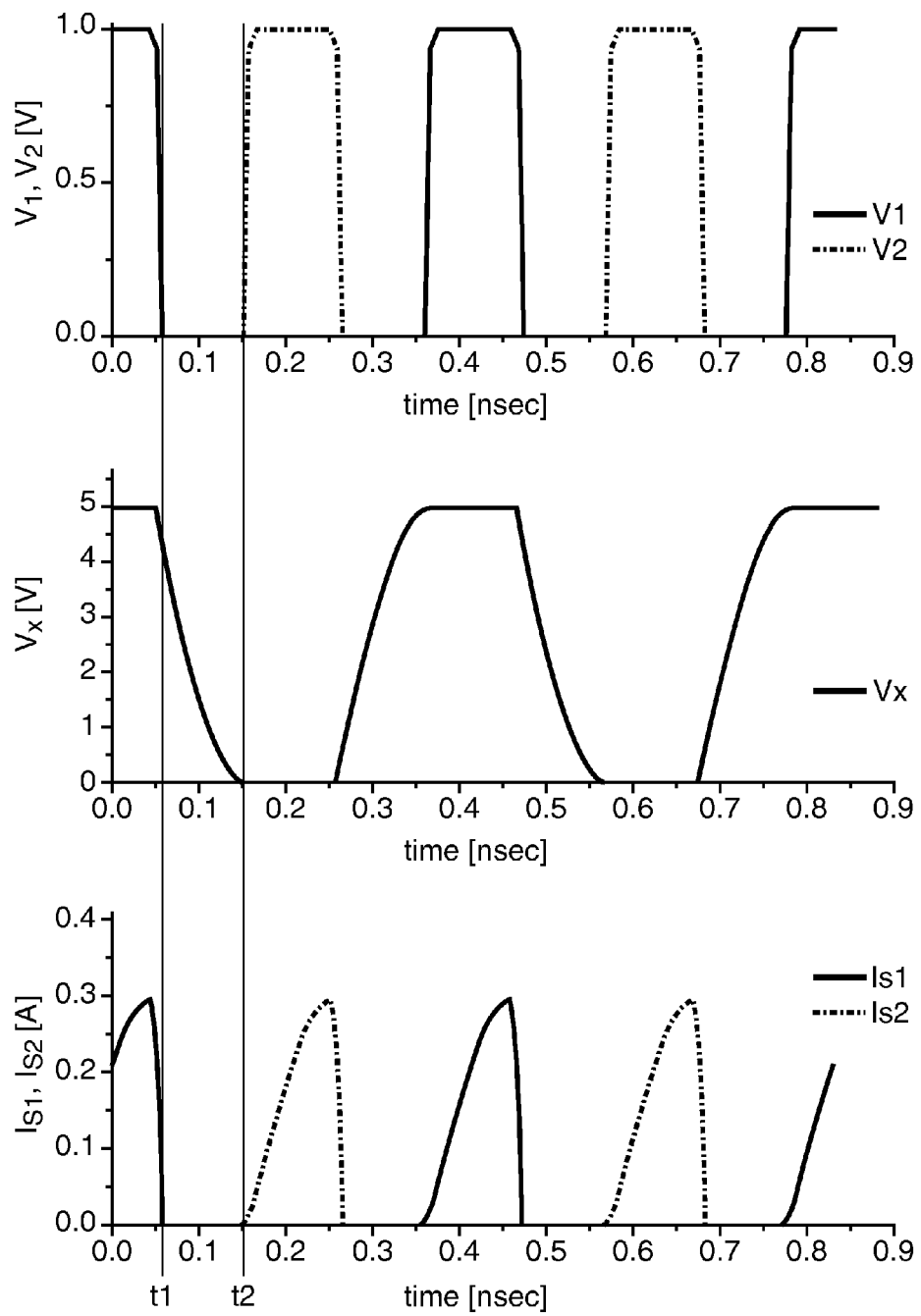
FIG. 5 illustrates the typical time domain signals of an ideal class-DE amplifier.

FIG. 5 illustrates the typical time domain signals of the ideal class-DE amplifier of FIG. 4, i.e. with duty-cycle d=25% and an $R_{ON}$=0. From FIG. 5 it can be seen that during the off-state, i.e. between the point of time t1 and point of time t2, the output capacitance $C_{DS}$ of the amplifier is charged and discharged under class-E conditions, i.e. zero-voltage switching, with the help of the inductor Lx.

Figure 6:
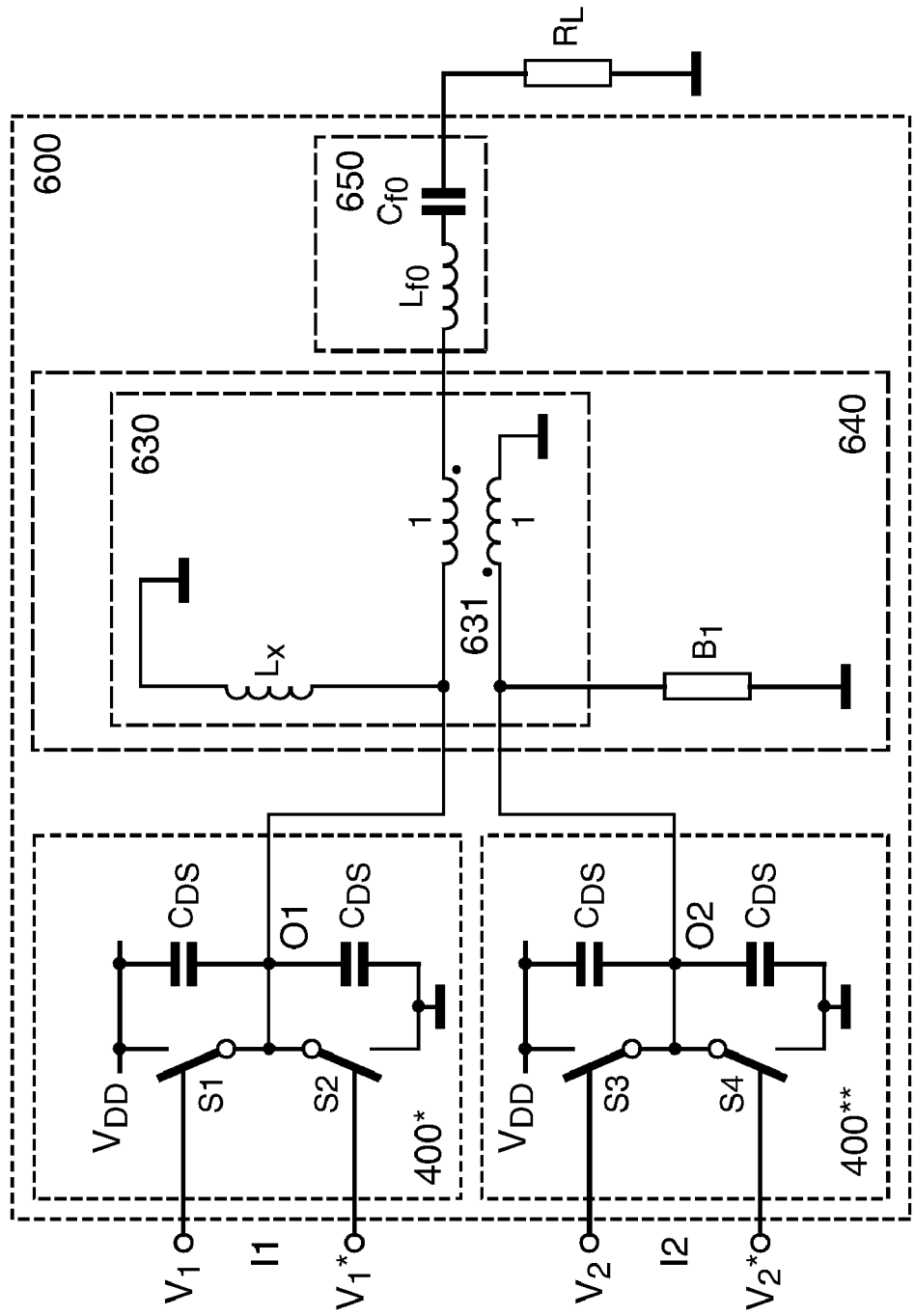
FIG. 6 shows a first embodiment of the present invention.

In FIG. 6, a first embodiment of the present invention is shown, where the class-DE PA 400 (referred to as 400*) of FIG. 4 is combined with a second class-DE PA 400** to form an out-phasing PA as first embodiment of the invention for the general class-DE out-phasing PA 600 as described in connection with FIG. 2. However, as difference to the circuit arrangement of FIG. 2, in the circuit arrangement of FIG. 6 the inductor Lx has been incorporated in the combiner structure; this saves on the total component count. Furthermore, any series leakage inductance can be incorporated in the series resonator tank 650 and any parasitic capacitance of the transformer structure 631 adds to the total parasitic capacitance of the out-phasing amplifier device itself.

To quantify the benefits of the circuit arrangement in accordance with the invention, the following four cases have been defined:
1. Combining two voltage-mode class-D amplifiers (d=0.5) without any additional reactive compensation, i.e. there are no load-angle inductors Lx, as described in connection with FIG. 1d;
2. Combining two class-DE amplifiers that are optimized individually for maximum efficiency for d=0.25 as is done in connection with FIG. 1e;
3. Combining two class-DE amplifiers as described in FIG. 6, where the duty-cycle d is re-optimized, but where the inductor Lx is unchanged, i.e. has same value as in case 2, according to the first aspect of the invention. Since the combiner is coherent, the additional reactive component B1 is not used.
4. Combining two class-DE amplifiers as described in FIG. 6, where the duty-cycle d is re-optimized and the additional reactive component B1 is used, but the inductors Lx are unchanged, i.e. the inductors Lx have the same values as in case 2. This embodiment corresponds to a combination of the first and second aspect of the invention. Accordingly, the combiner is non-coherent.

Figure 7:
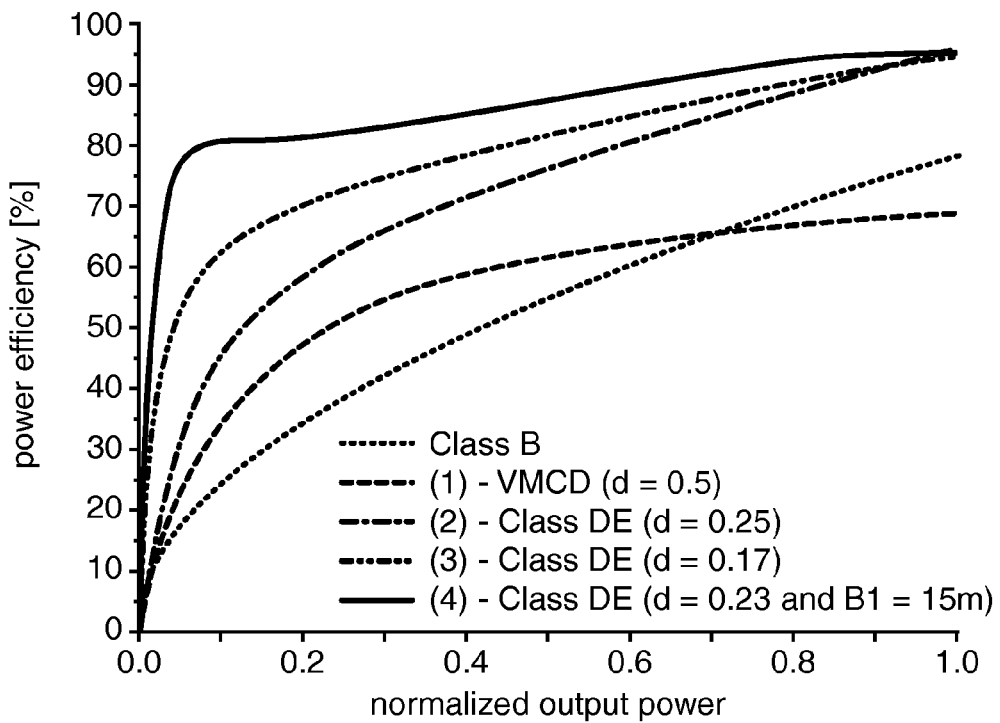
FIG. 7 depicts simulated power efficiency as function of normalized output power ($P_{out}/max(P_{out})$) for four cases.
Figure 8:
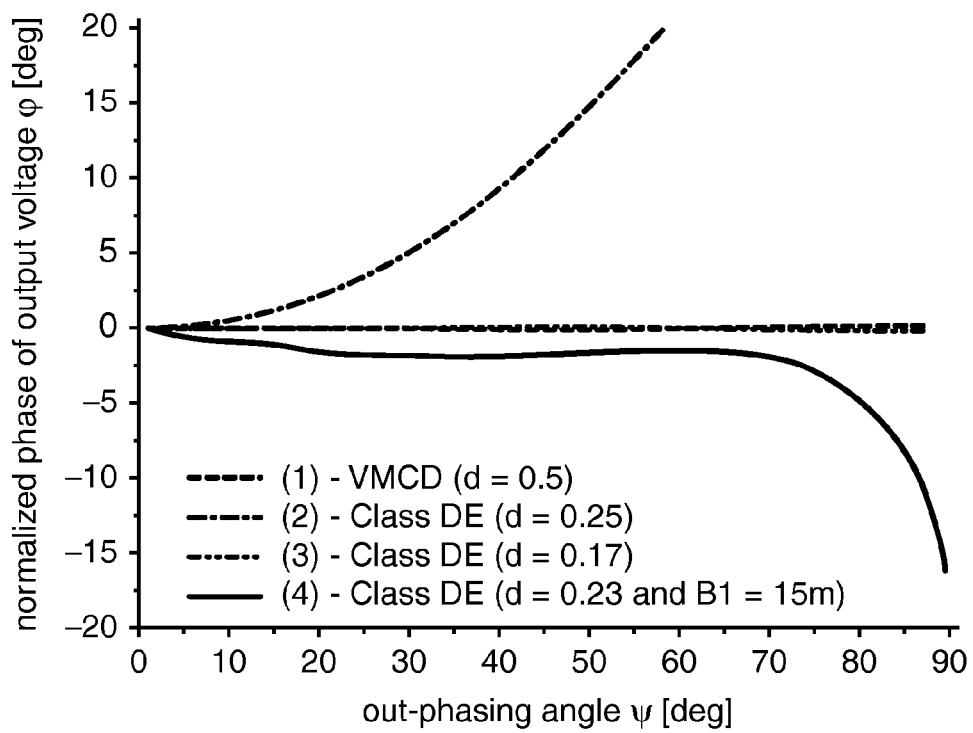
FIG. 8 shows the simulated normalized phase $\phi'$ of the output power as function of the out-phasing angle $\Psi$ for the four cases of FIG. 7.
Figure 9:
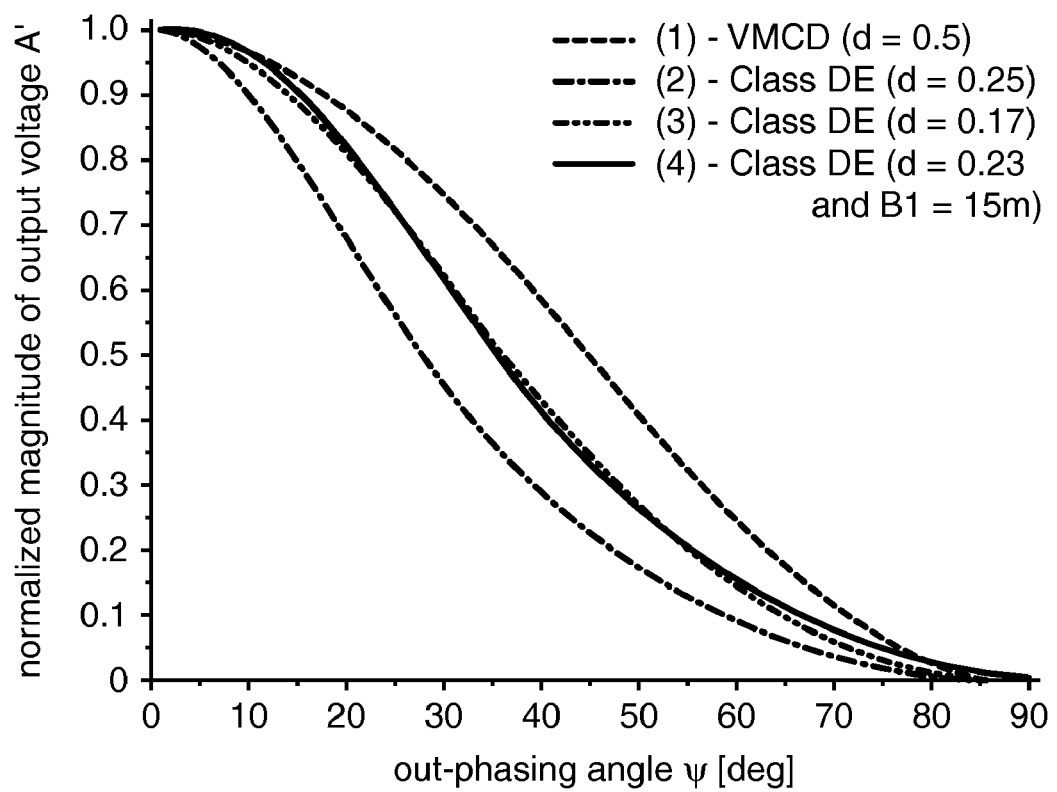
FIG. 9 shows the simulated normalized amplitude A' of the output power as function of the out-phasing angle $\Psi$ for the four cases of FIG. 7.

FIG. 7 depicts the simulated power efficiency as function of normalized output power ($P_{out}$/max($P_{out}$)) for the four cases as defined above. For reference also the power efficiency of a class-B PA is included, which is definitely outperformed by the invention. FIG. 8 and FIG. 9 show the simulated normalized phase (φ' and amplitude A' of the output power as function of the out-phasing angle Ψ.

Accordingly, the conventional Voltage-Mode Class-D (in short, VMCD) PA that operates at a duty-cycle of 50% suffers from the switching losses in the output capacitance. If comparing the efficiency to a class-B PA, the VMCD PA is only marginally better at lower output powers. If the class-DE PA is used with all element values optimized according to equations (6) to (10) above, efficiency after combining is much better in comparison to the VMCD, i.e. curve (2) in FIG. 7.

However, curve (2) in FIG. 8 shows that just combining to optimize class-DE amplifiers results in severe AM-PM non-linearity, since the output phase is non-linear with respect to the out-phasing angle, which contains the envelope amplitude information. By means of the first aspect of the invention this problem can be solved. That is, by means of re-optimizing the duty-cycle with the given element values $R_{L,DE}$ and Lx. For instance, in the illustrative example embodiment, adjusting the duty-cycle to d=0.17 (17%) results not only in a constant output phase as a function of out-phasing angle, but also in a better power efficiency, as can be seen from curve (3) in FIG. 7 and FIG. 8.

It is worth to be noted that the duty-cycle adjustment could be done in a digital calibration and/or pre-distortion routine during start-up of the device containing the PA, e.g. a radio, where this is a desired capability, in particular in software-defined-radio (SDR).

Lastly, in accordance with the second aspect of the invention, by means of making the combiner non-coherent, i.e. by either adding an additional reactive component B1 at either of the two PA outputs, or choosing respective different parallel inductors Lx and Lx* in both paths to make the paths electrically asymmetric, the power efficiency is boost as shown in curve (3) of FIG. 7 and FIG. 8. It is noted that in all cases some amplitude pre-distortion function may be needed as shown in FIG. 9. The simplest relation is given by equation (4), which only holds for case 1, i.e. the VMCD PA.

Figure 10:
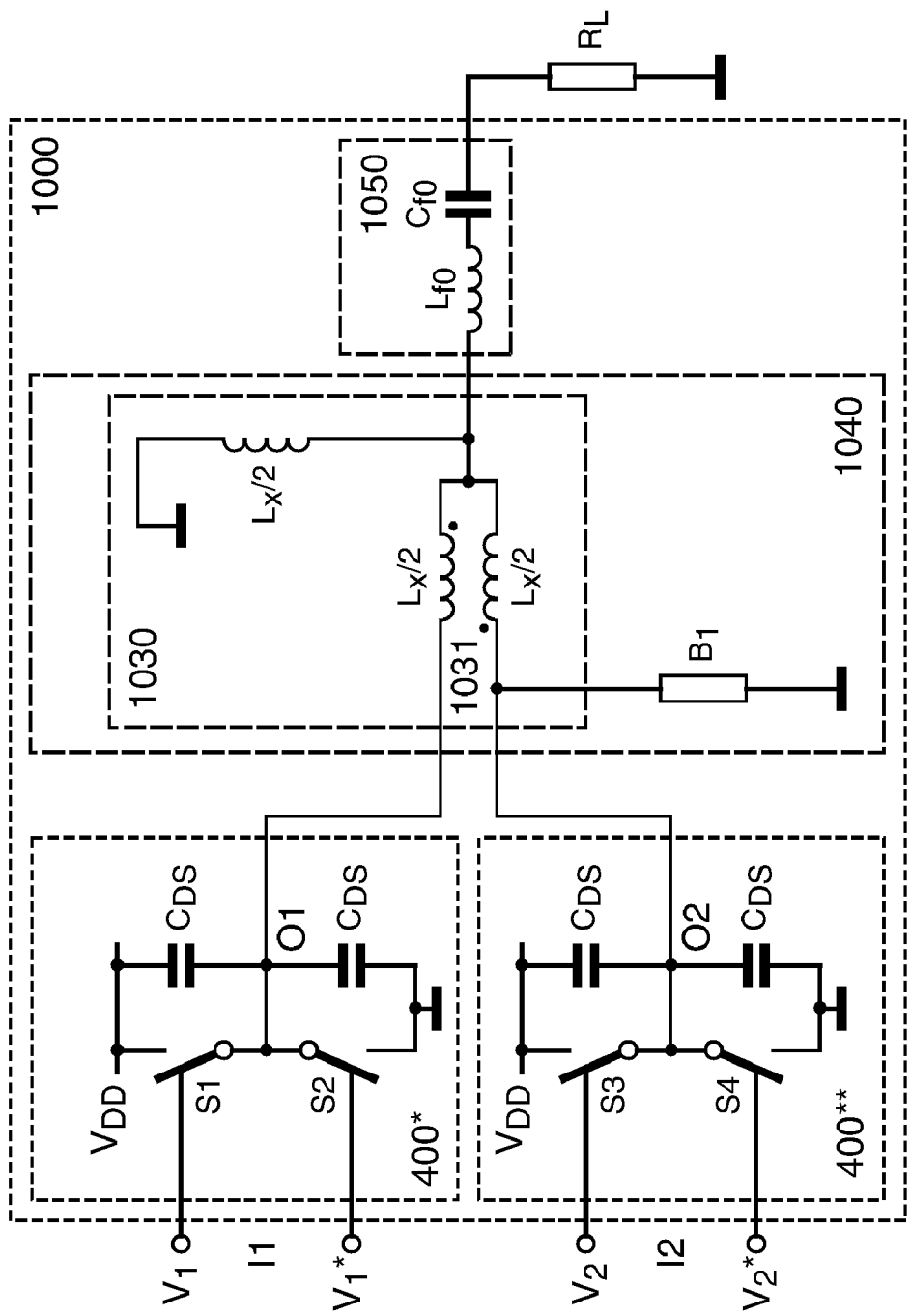
FIG. 10 shows a second embodiment of the invention.

FIG. 10 shows a second embodiment of the invention, where again the class-DE PA 400 (referred to as 400*) of FIG. 4 is combined with a second class-DE PA 400** to form an out-phasing PA 1000. The inductor Lx has been conveniently incorporated in the combiner structure 1031 to save on the total component count. Any parasitic capacitance of the transformer structure 1031 adds to the total parasitic capacitance of the device 1000. It is noted that a parallel resonant tank at the output may alternatively be used instead of the series resonator tank 1050. Then, the output inductor $Lx_{/2}$ can be merged with the parallel resonator tank. It is further worth to be noted that the load resistance of this structure is 4 times smaller as in the embodiment of FIG. 6 due to the transformation properties of this network.

Figure 1A:
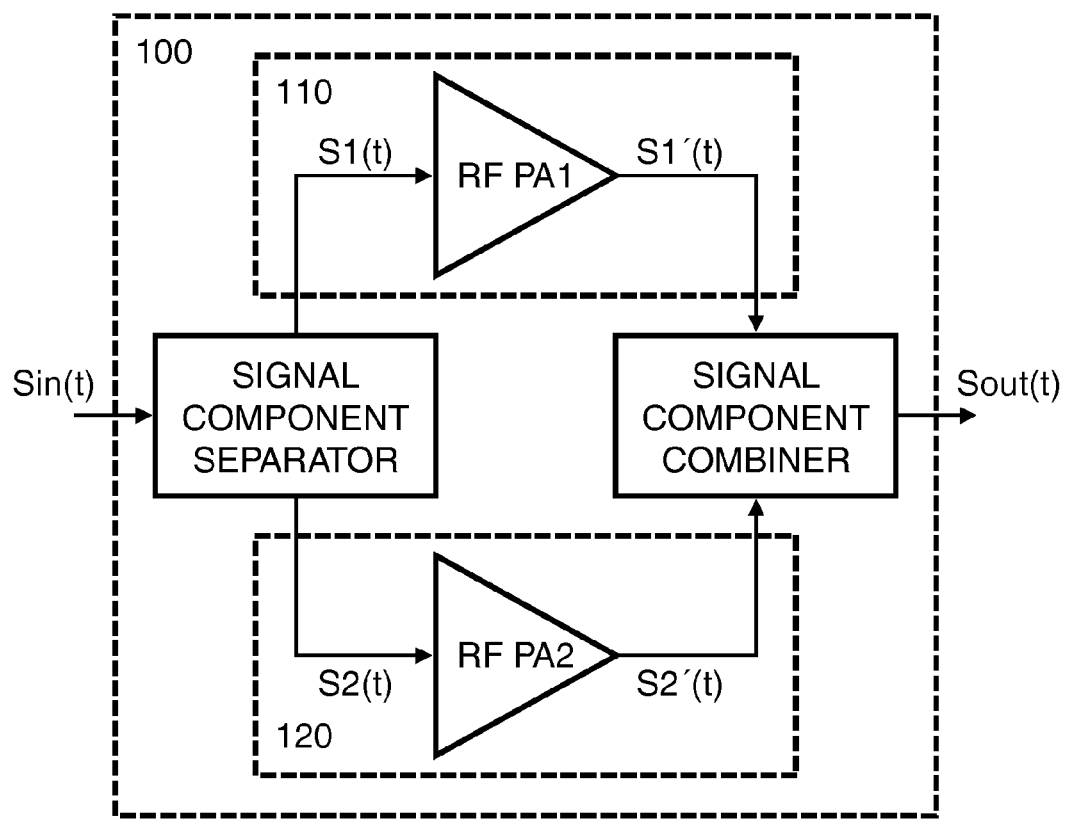
FIG. 1a is an illustration of the conventional LINC or out-phasing concept.
Figure 1B:
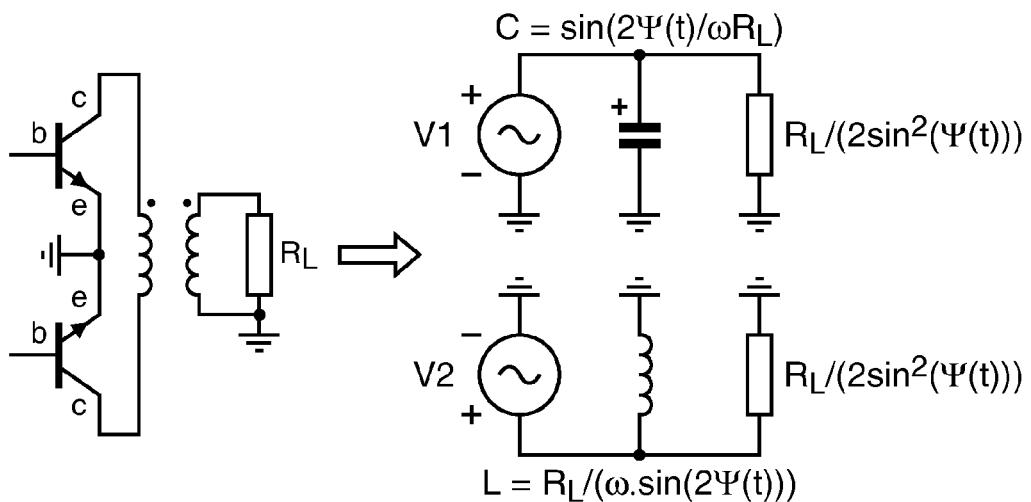
FIG. 1b depicts a simplified equivalent circuit of a differential output signal combiner connected to a saturated power amplifier.
Figure 1C:
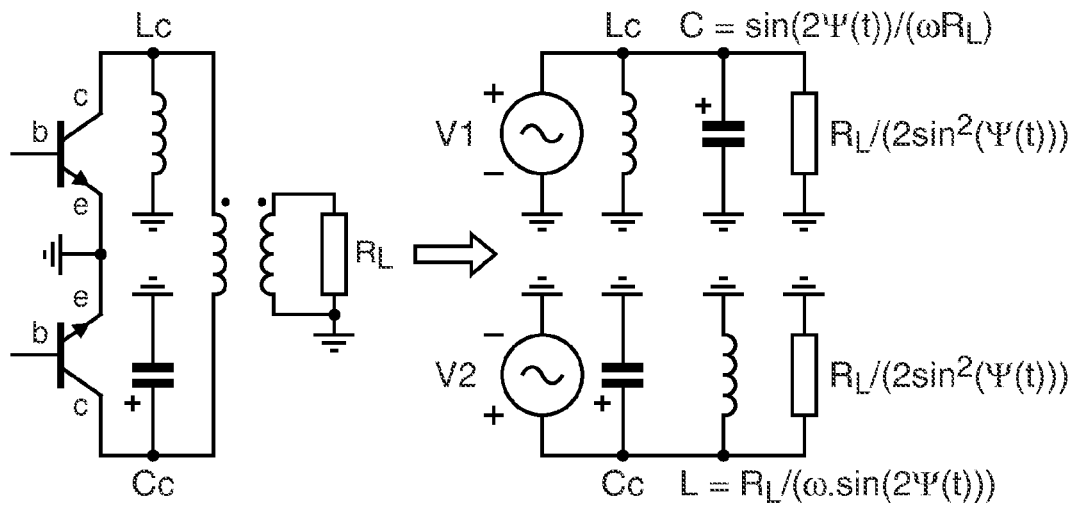
FIG. 1c depicts cancellation of the reactive part of the effective load impedance by fixed compensating reactances proposed by Chireix.
Figure 1D:
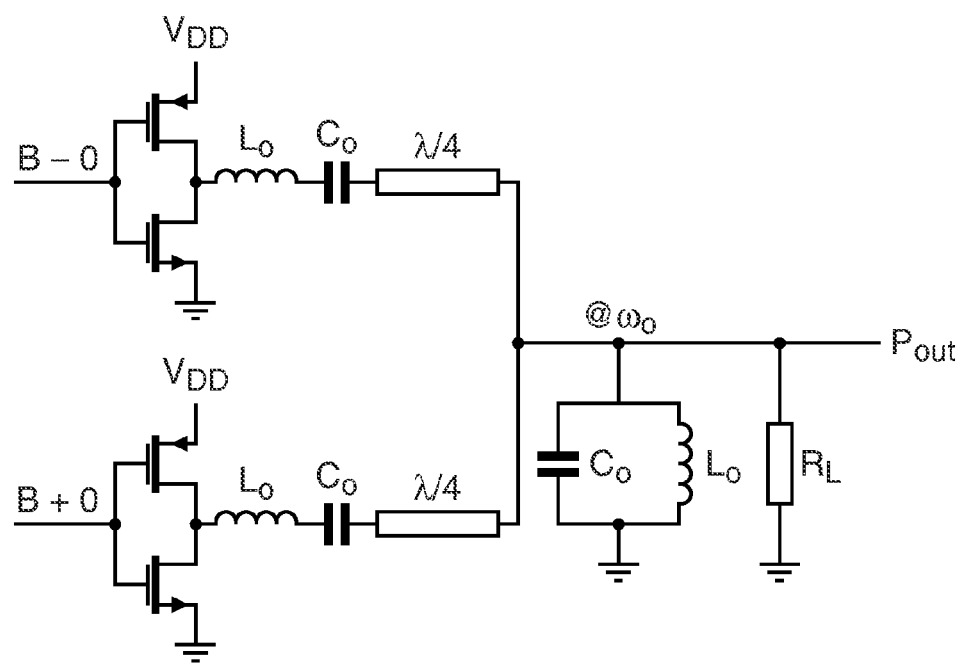
FIG. 1d depicts a CMOS implementation of a class-D out-phasing amplifier with transmission line coupler.
Figure 1E:
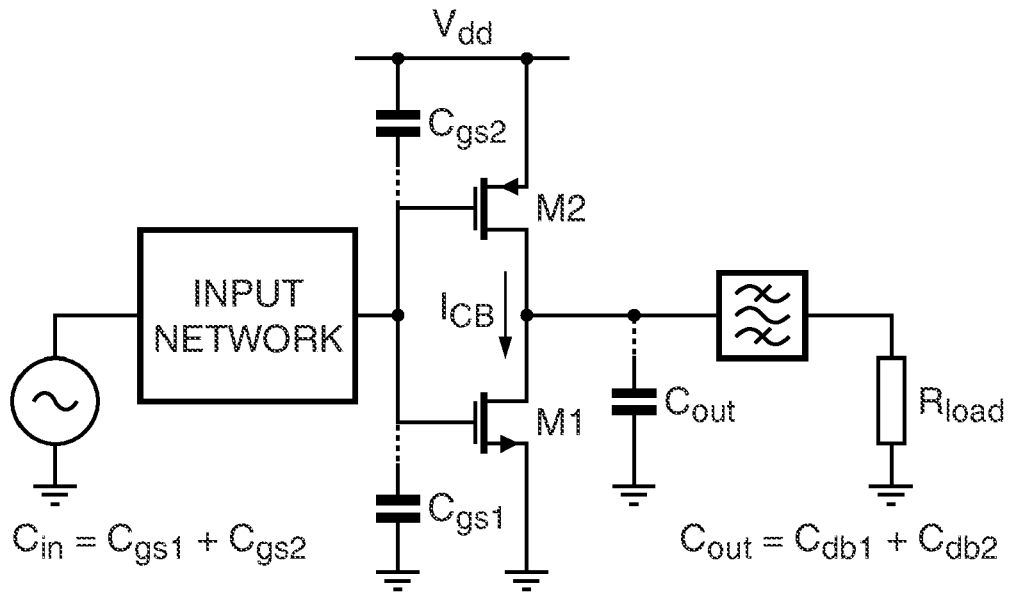
FIG. 1e shows a class-D PA with adequate dead-time, i.e. a class-DE PA.
Figure 1F:
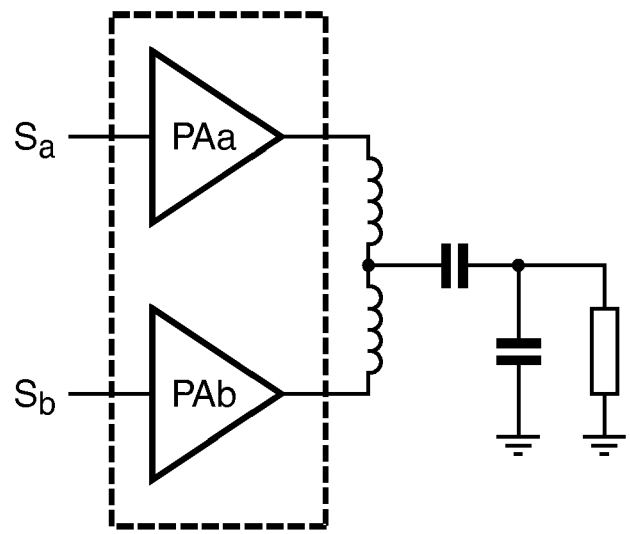
FIG. 1f shows two PAs of FIG. 1e in an out-phasing configuration using a combiner circuit without Chireix components.
Figure 11:
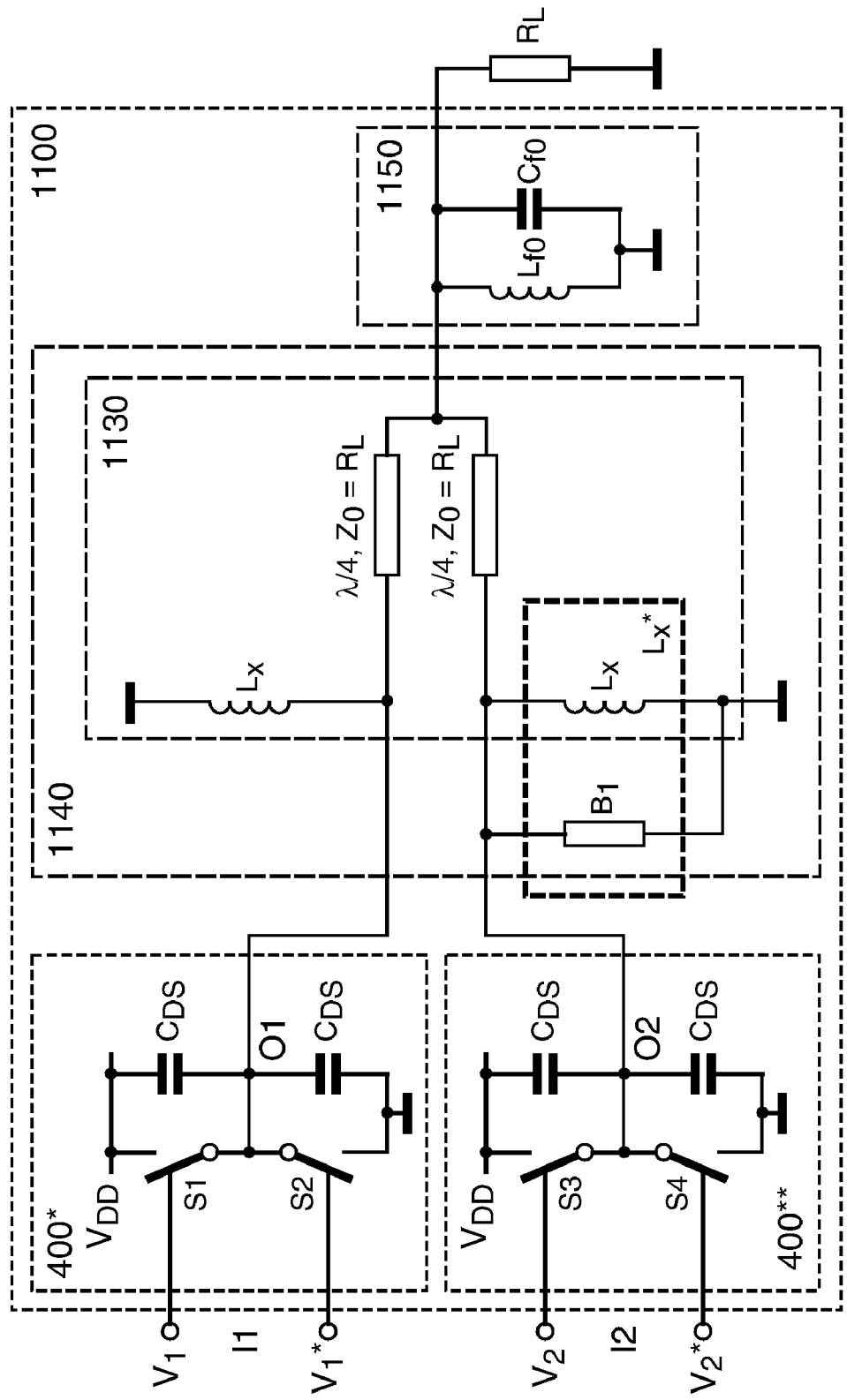
FIG. 11 shows a third embodiment of the present invention.
Figure 12:
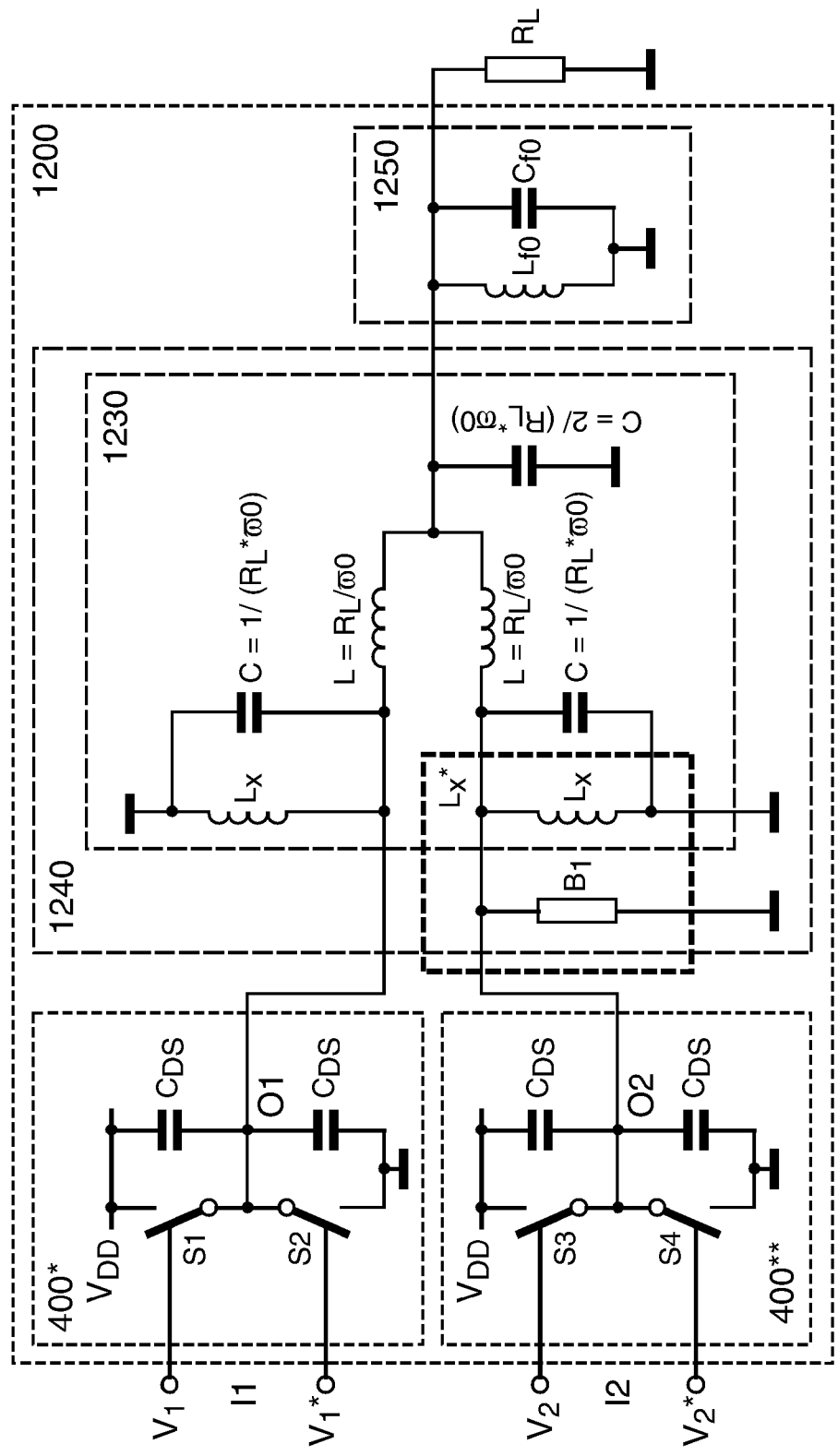
FIG. 12 shows a fourth embodiment of the present invention.

FIG. 11 and FIG. 12 show a third and fourth embodiment of the invention, where the class-DE PA 400 (referred to as 400*) of FIG. 4 is combined with a second class-DE PA 400** to form an out-phasing PA 1100 or 1200, respectively, and where a transmission line combiner 1131 or 1231, respectively, is used as shown in FIG. 1d. The difference is that the amplifiers 400*, 400** are operated in class-DE mode by including the parallel inductors Lx and operating the amplifiers 400*, 400** at a duty-cycle d<0.5 (50%) to accommodate zero-voltage switching during the dead time.

It will be appreciated that, as in all embodiments of the present invention, the combiner 1130 or 1230, respectively, can be made non-coherent according to the second aspect of the invention by including a respective reactive component B1 at either one of the outputs of the two PAs 400*, 400** or by having respective different parallel inductors Lx and Lx* in both paths to make the paths electrically asymmetric.

It is noted that the illustration of the circuit in FIG. 12 is a lumped equivalent of the combiner, i.e. some of the capacitors can be merged with other capacitive element(s), e.g. with the capacitor of the output tank 1250.

Figure 13:
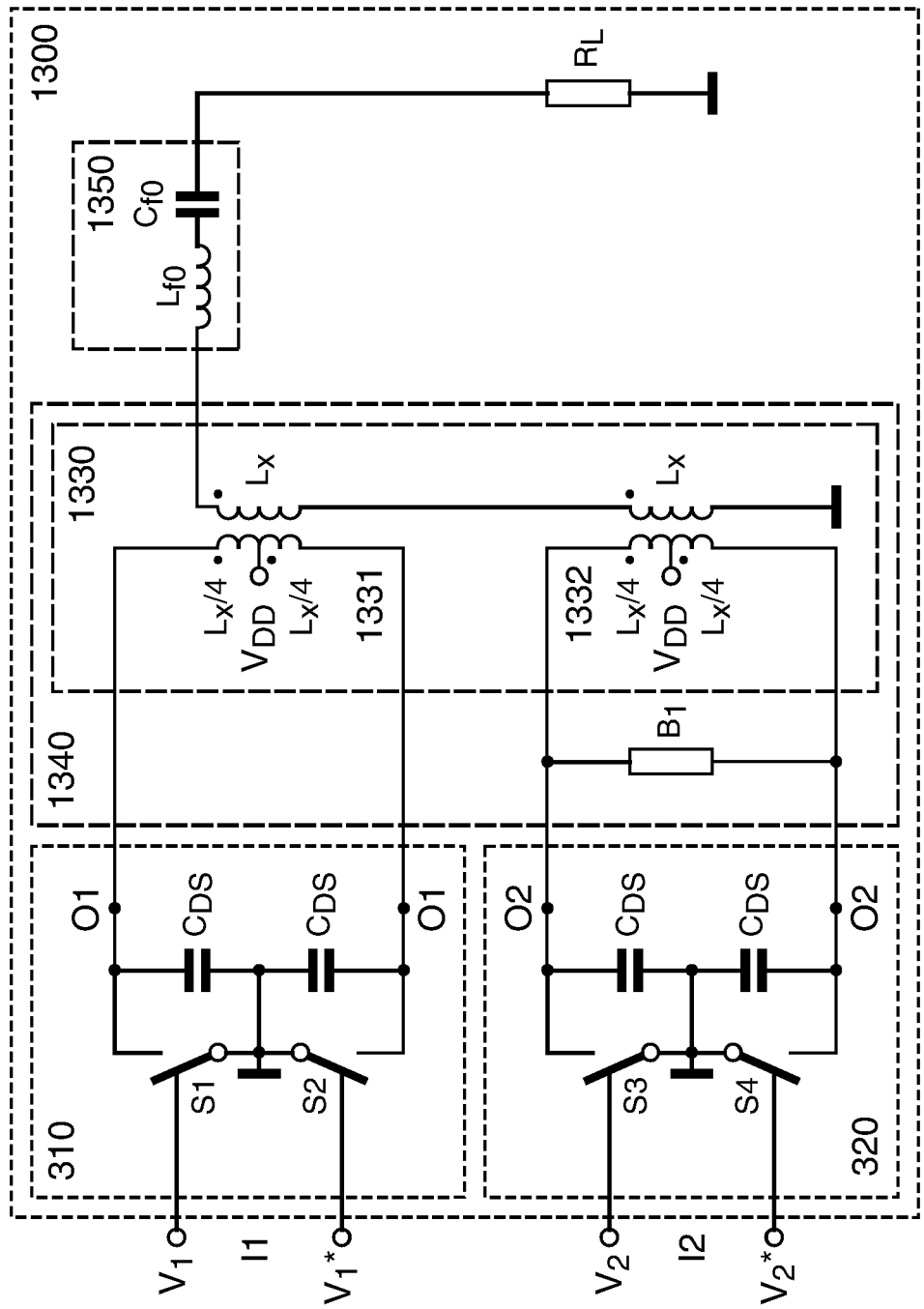
FIG. 13 shows a fifth embodiment of the present invention.

FIG. 13 shows a fifth embodiment of the invention, which is based on a push-pull transformer coupled class-DE circuit arrangement 1300. This configuration is a more practical implementation of the general schematic shown in FIG. 3. The transformer-coupled implementation may advantageously be considered when no complementary switching devices S1-S4 are available in the used technology. Moreover, the output signals of both amplifiers 310, 320 can be easily summed by just stacking the transformers 1331, 1332.

It is noted that, as in the first and second embodiment, the class-DE reactive components Lx have been conveniently incorporated in the transformer design itself, which saves on the component count again. Further, any parallel capacitance of the transformers 1331, 1332 can be added to the parasitic capacitance of the PA 1300 itself.

Figure 14:
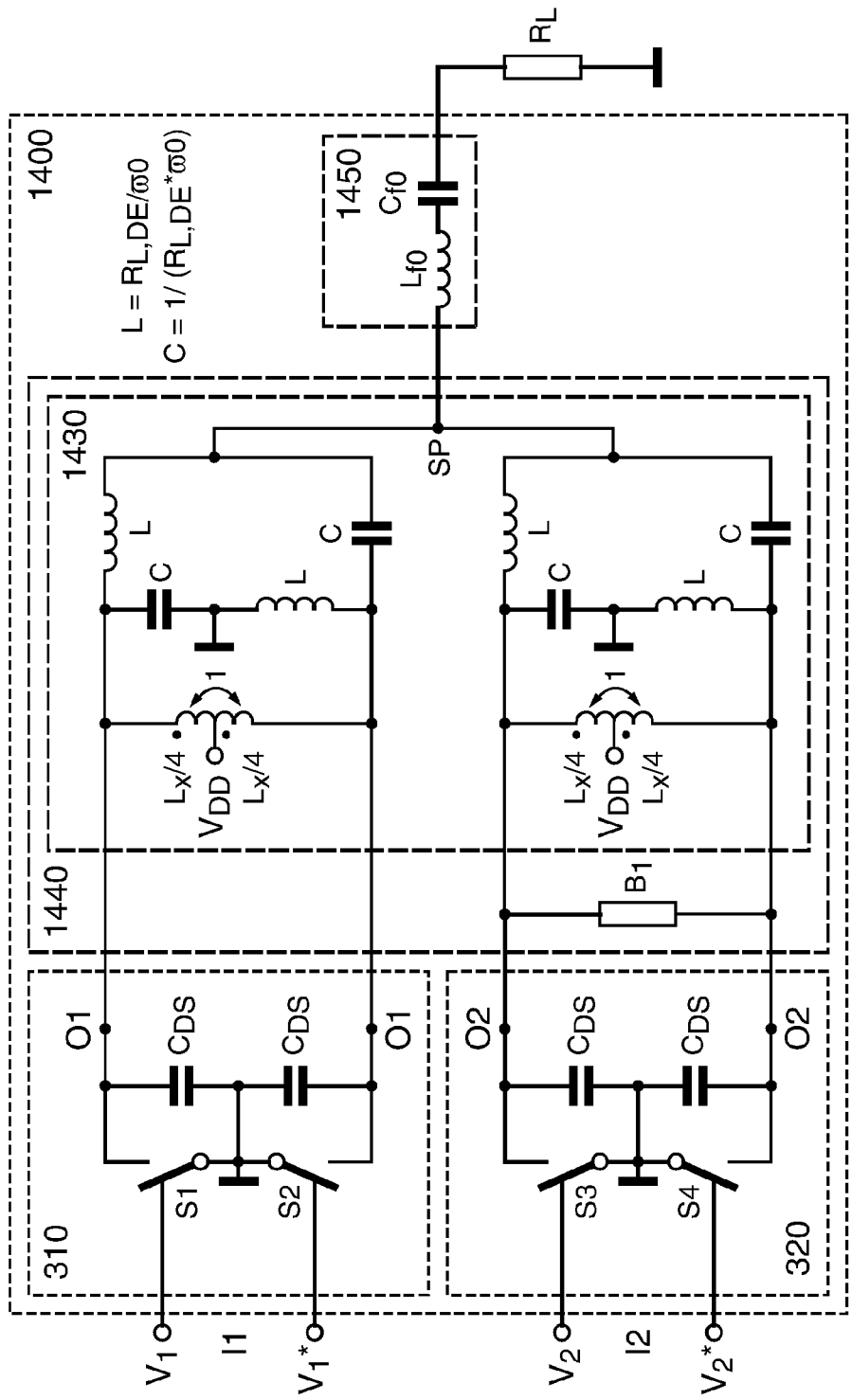
FIG. 14 shows a sixth embodiment of the present invention.

FIG. 14 shows a sixth embodiment of the invention, which is based on a push-pull transformer coupled class-DE circuit arrangement 1400. The transformer balun of the circuit arrangement 1300 of FIG. 13 has been replaced by a lattice balun. The lattice type baluns has the advantage that the magnetic coupling is not limiting the performance in terms of insertion loss. Moreover, the output signals of both amplifiers 310, 320 can be summed by just connecting the outputs of the baluns, i.e. by current summing at point SP.

It is noted that the class-DE reactive components Lx are incorporated in the bias inductor connected to $V_{DD}$ via middle tapping. The bias inductor is a differential inductor with tight coupling in order to set all even harmonics to zero. This condition is mandatory for optimum class-D operation in general.

Figure 15:
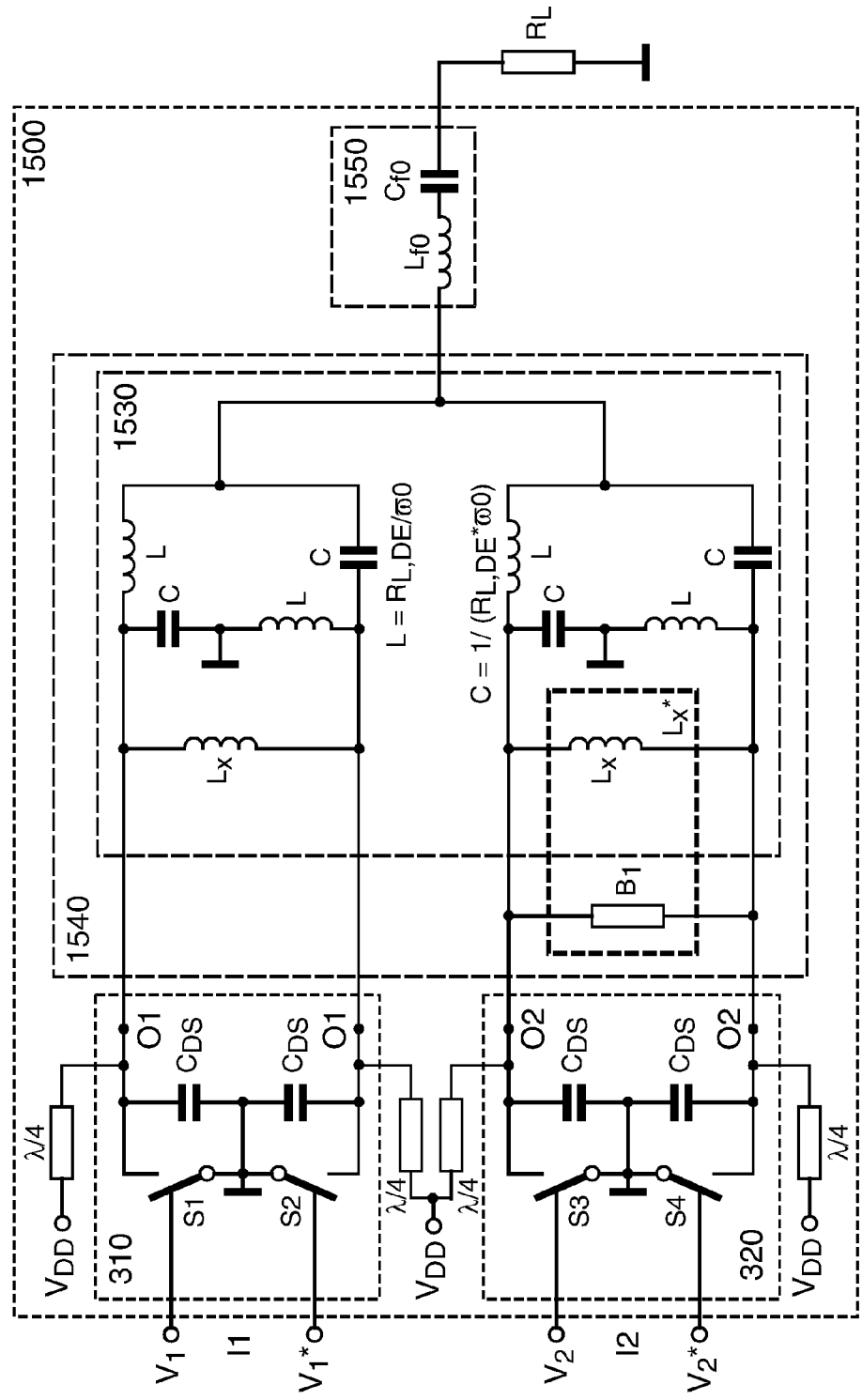
FIG. 15 shows a seventh embodiment of the present invention.

FIG. 15 shows a seventh embodiment of the invention, which is based on a push-pull transformer coupled class-DE circuit arrangement 1500. The respective bias inductors are replaced by short-circuited λ/4-transmission (referred to by λ/4 in FIG. 15) that act as even-harmonic short for class-D operation.

In a further development of the present invention, alternatively or additionally to the use of a Chireix combiner, i.e. a non-coherent combiner, can be avoided by operating the switching-mode power amplifiers in out-phasing configuration at different duty-cycles in accordance with the third aspect of the present invention. In the first to seventh embodiments described above, the duty-cycle for the two amplifying branches has been assumed to be identical and the power efficiency in back-off has proposed to be improved by means of the Chireix combiner technique for compensation of the unwanted reactive load.

Basically, impedance is set by the ratio of voltage and current. As discussed above, the Chireix approach uses a compensating reactive element in parallel with the load of one amplification branch to change the voltage-current phase relation. According to the third aspect of the invention it has been found that by means of changing the switching duty-cycle, controlling of the phase of the output signal in a high-efficiency switching mode amplifier, e.g. class-D, class-DE, class-E, class-F, or class-E/F operation mode, is possible. The basic effect, discussed in M. Albulet, *RF Power Amplifiers*, Chapter 4, Noble Publishing. Atlanta, Ga., 2001, can reason that the reactive compensation can be controlled by operating both the amplifiers at different duty-cycles. This is here introduced as a kind of 'digital Chireix' approach.

Figure 16:
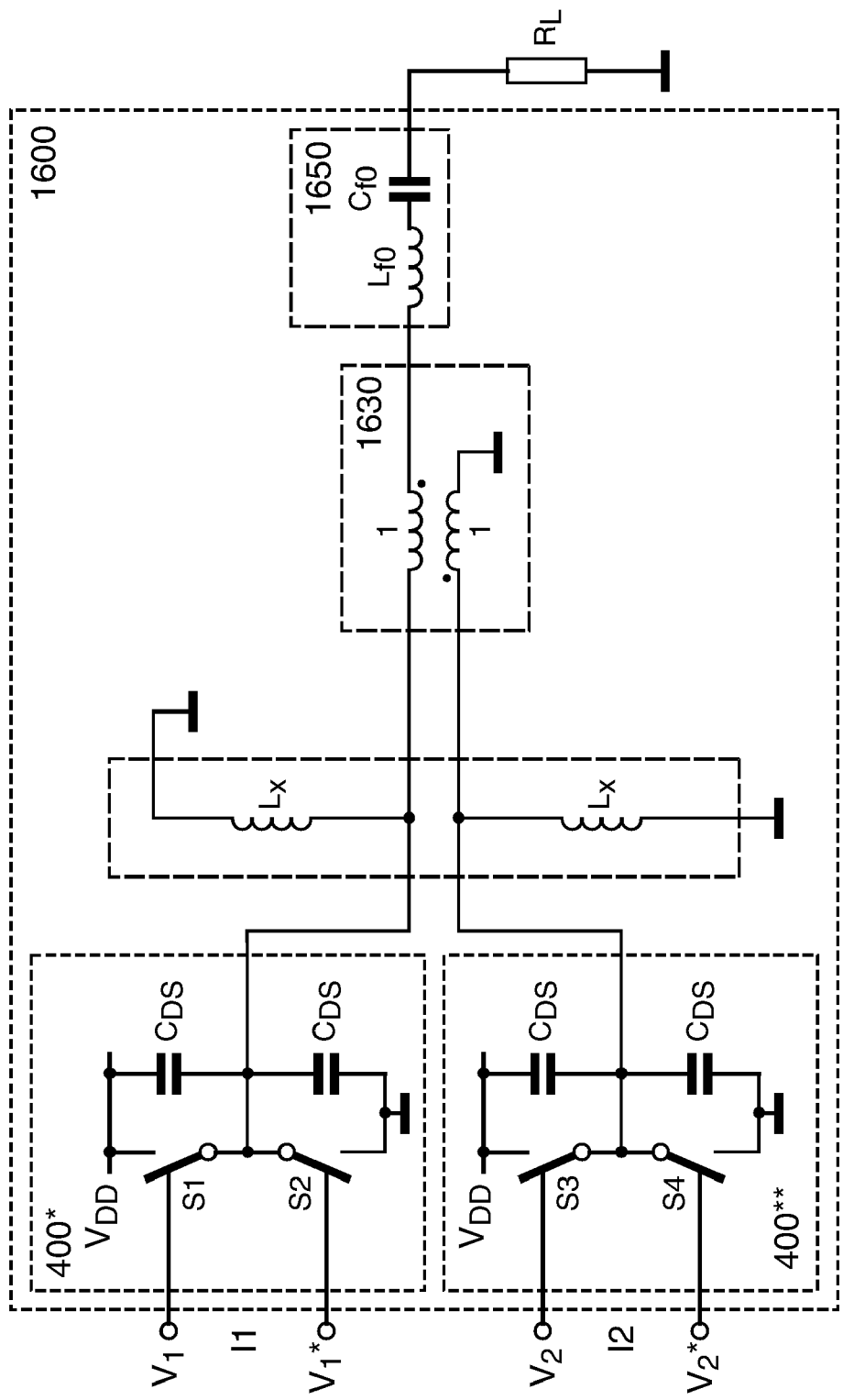
FIG. 16 shows a first embodiment of a further development of the present invention.
Figure 17:
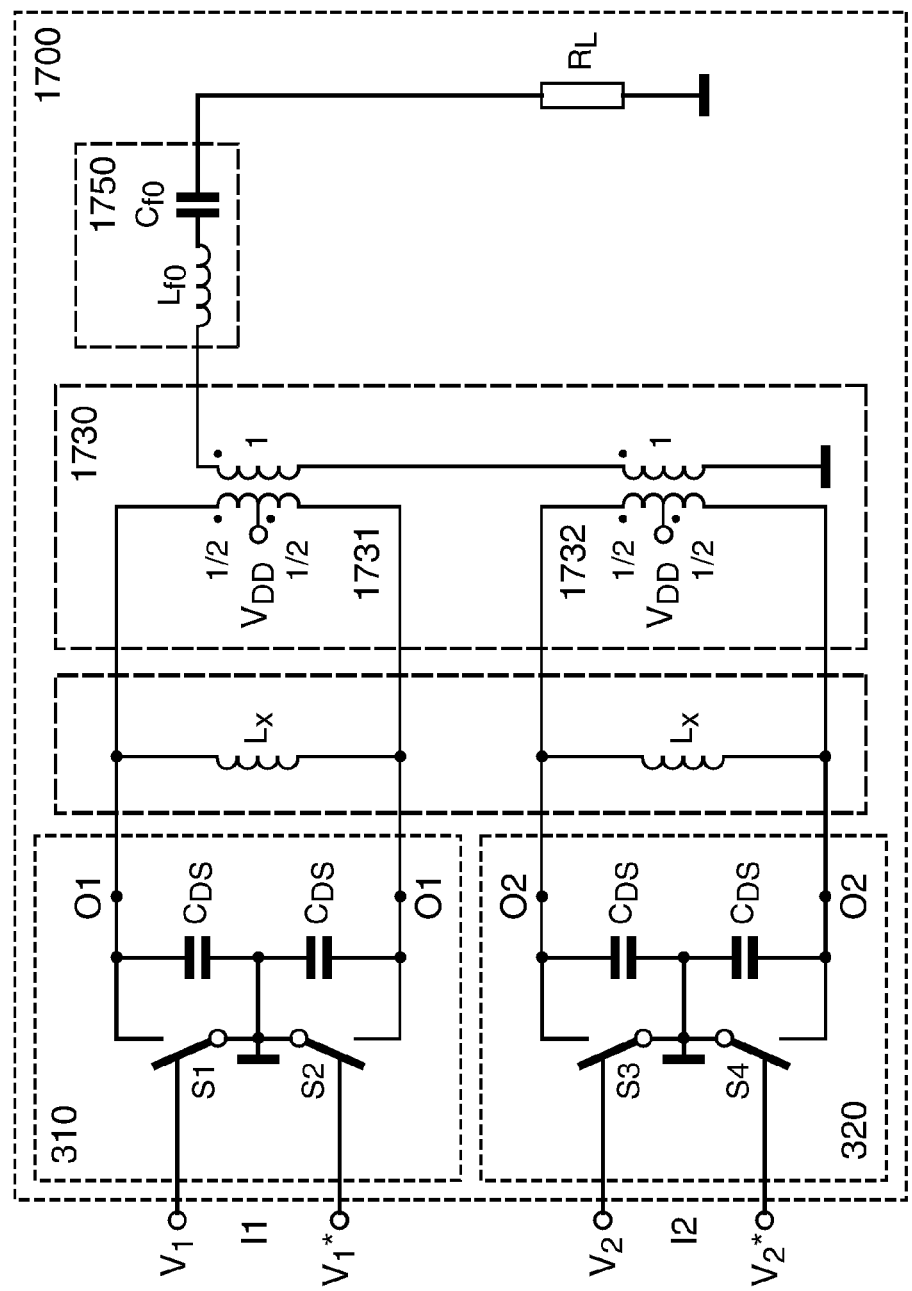
FIG. 17 shows a second embodiment of the further development of the present invention.

Respective two basic out-phasing switching-mode PA circuit arrangements 1600 and 1700 are shown in FIG. 16 and FIG. 17, where in comparison to FIG. 2 and FIG. 3, in particular the additional (Chireix) reactive element is no longer needed. The respective switching driver signals V1 and V2 for each amplification branch are differential square wave signals with different duty-cycles d1 and d2. FIG. 16 (corresponding to FIG. 2) is based on the complementary class-DE implementation. FIG. 17 (corresponding to FIG. 3) shows a push-pull transformer-coupled class-DE implementation.

It is worth to be noted that it has been found that this technique is applicable to any out-phasing transmitter where switching-mode power amplifiers are used, such as class-D, class-DE, class-E, and class-F. However, class-DE is preferred when the voltage swing is restricted to prevent reliability issues such as in deep sub-micron CMOS. Also, it should be appreciated that various combiner topologies can be applied, some embodiments of which have been already described with the first to seventh embodiments above.

For a better illustration of the third aspect of the invention, in the following a practical example is described with a 2.4 GHz transformer-coupled class-DE PA with a duty-cycle of 25%, which is a good compromise in terms of power capability and maximum class-DE frequency of operation. As only non-idealities $R_{ON}$ and $C_{DS}$ of the switching device are taken based on data of a GaN transistor. The switching stage operates from a supply voltage $V_{DD}$=50V. The $R_{ON}$=1.3 Ohm and $C_{DS}$=1.2 pF. For a duty-cycle d=0.25 (25%), the circuit parameters in FIG. 4 are $R_L$=244Ω and Lx=5.15 nH, which yields a maximum $P_{out}$=50 dBm, when the amplifiers operate in-phase.

To better illustrate the benefits of the proposed solution according to the third aspect of the invention, the following assumptions, by way of an example, are made:
1. Combining two voltage-mode class-D amplifiers with a duty-cycle d=0.5 and without any additional reactive compensation, i.e. there are no load-angle setting inductors Lx as described in connection with FIG. 1d.
2. Combining two class-DE amplifiers that are both optimized individually for maximum efficiency at identical duty-cycles d1=d2=0.25 as is done in connection with FIG. 1e.
3. Combining the two class-DE amplifiers of case 2, but now the duty-cycle is re-optimized and equal for both Pas, i.e. the duty-cycles are d1=d2=0.33.
4. Combining the two class-DE amplifiers of case 2, where the duty-cycle is again re-optimized as d1=d2=0.27 and further a reactive compensation component B1 is used the circuit, i.e. 'analog' Chireix technique.
5. Combining the two class-DE amplifiers of case 2, but the duty-cycle for the individual PA branches is optimized with d1=0.23 and with d2=0.35, which is the essential feature according to the further development, i.e. according to third aspect of the invention.

Figure 18:
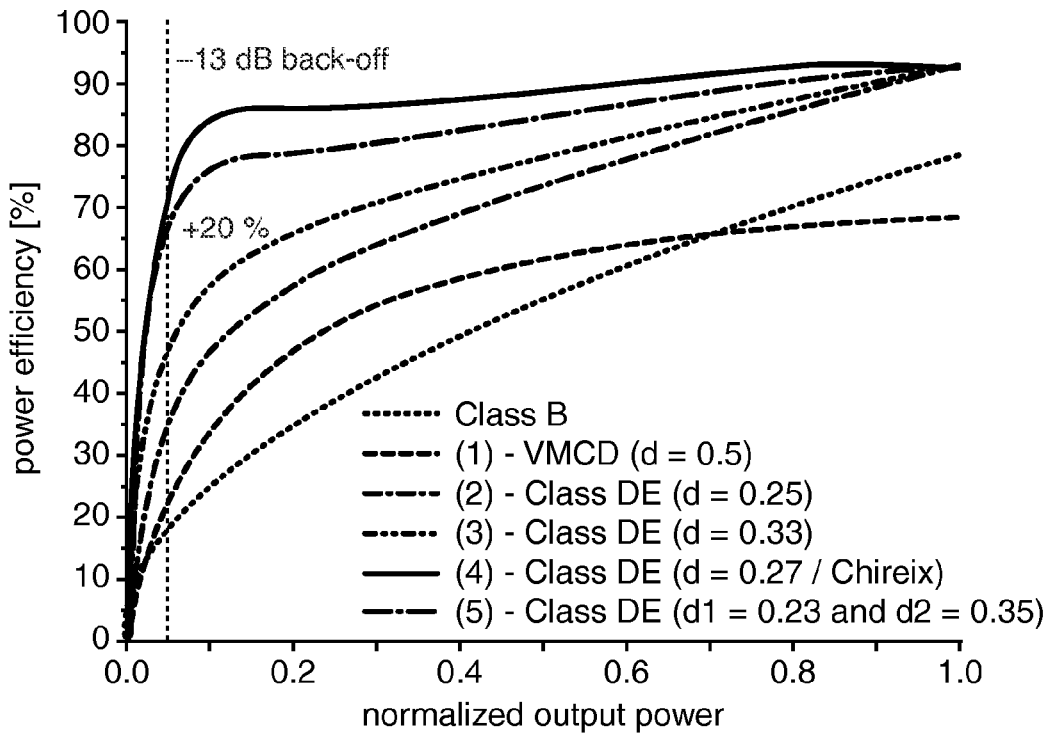
FIG. 18 depicts simulated power efficiency as function of normalized output power ($P_{out}/max(P_{out})$) for five cases.
Figure 19:
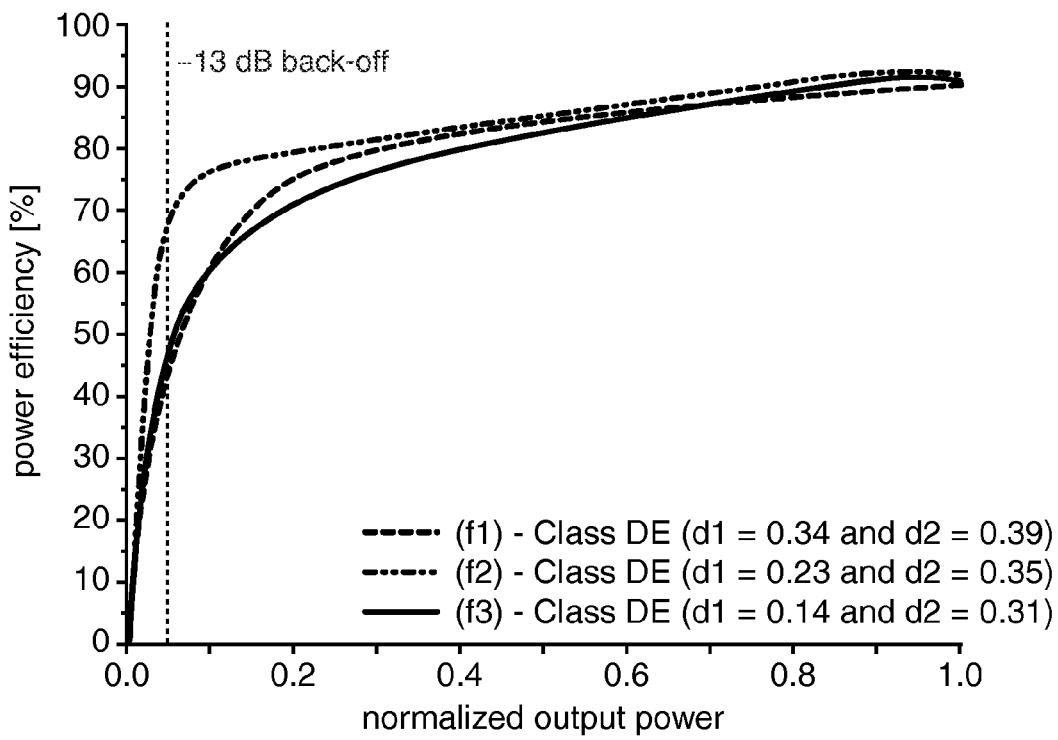
FIG. 19 depicts power efficiency versus normalized output power of the class-DE out-phasing PA at f1=2.1 GHz, f2=2.4 GHz and f3=2.7 GHz.
Figure 20:
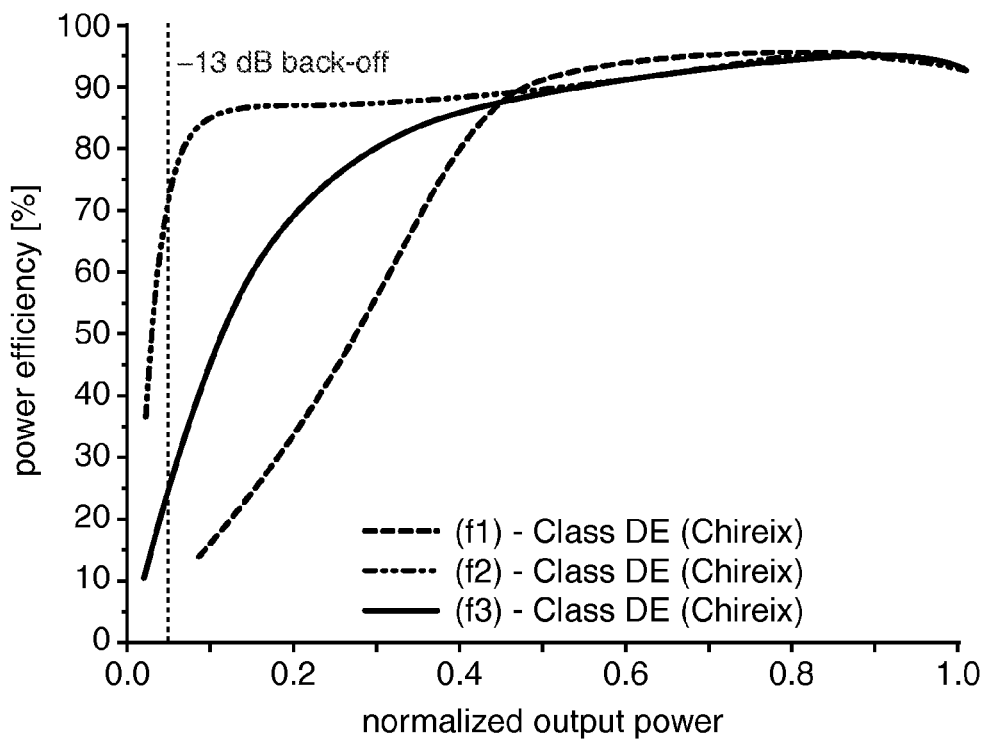
FIG. 20 depicts power efficiency versus normalized output power of the class-DE out-phasing PA using the Chireix combining technique at f1=2.1 GHz, f2=2.4 GHz and f3=2.7 GHz.

FIG. 18 shows the simulated power efficiency as function of normalized output power ($P_{out}$/max($P_{out}$)) for the five cases defined above. For reference also the power efficiency of a class-B PA that is illustrates the best efficiency from a linear PA. From FIG. 18 it can be seen that in case (5), i.e. the 'digital Chireix' approach according to the third aspect of the invention, the efficiency can be improved another 20% points in back-off compared to case (3), where equal duty-cycles are used. As a reference the 13 dB back-off point ($P_{norm}$=0.05) is used, since most modern communication standards have a peak-to-average ratio (PAR) within this range. Although the efficiency is not as high as with a Chireix combiner, the proposed method has fewer drawbacks. For instance, if a 25% bandwidth of the system (2.1-2.7 GHz) is assumed, FIG. 19 shows that efficiency versus output power profile can almost be recovered completely by re-tuning the duty-cycles of the separate switching stages, as proposed by the third aspect of the invention. In contrast, a traditional Chireix amplifier does not have this property, since the compensating reactance limits the useful bandwidth as shown in FIG. 20, wherein power efficiency versus normalized output power of the class-DE out-phasing PA at f1=2.1 GHz, f2=2.4 GHz and f3=2.7 GHz is illustrated. The individual duty-cycles of the switching stages have been re-optimized.

Finally, yet importantly, it is worth to be noted that the 'digital' Chireix approach of the invention can be combined with the conventional, i.e. 'analog', Chireix technique, i.e. as a 'mixed-signal' Chireix, by using a Chireix combiner in combination with optimum duty-cycle operation of the individual amplifying stages.

Figure 21:
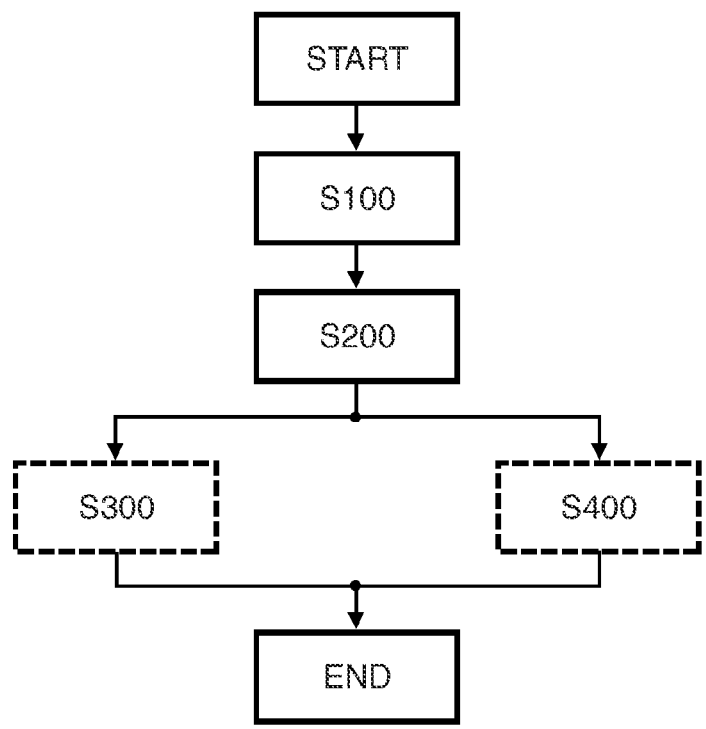
FIG. 21 illustrates the essential steps of the method according to the present invention for setting optimized parameter values for an out-phasing amplifier.

FIG. 21 illustrates the essential steps of the method according to the present invention for setting optimized parameter values for the out-phasing amplifier circuit arrangements as discussed herein above.

The method starts (START) at a RF power amplifier circuit arrangement for amplification of RF input signals with modulated amplitude and modulated phase, wherein the circuit comprises first and second amplification branches each having an input and an output, for amplifying one of a first and a second component signal of which only the phase is modulated, and a combination of which corresponding to the RF input signal, wherein in each of the first and second amplification branches, respective first and second amplification devices are configured to operate in a switching-mode with a respective duty-cycle, and wherein a combination circuit is configured to combine the outputs of the first and second amplification branches such that the circuit arrangement is arranged for operating in an out-phasing configuration.

Firstly, at step S100 values of first and second reactive inductive components of the combination circuit connected to respective first and second amplification device outputs of the respective first and second amplification devices are set in accordance with the criteria of zero-voltage switching for each of the first and second amplification devices as a separate component.

Next, at step S200 the first and second duty-cycles for operating the first and second switching-mode amplification devices are adjusted in accordance with the criteria of a constant phase of the output signal of the circuit arrangement with respect to the out-phasing angle of the out-phasing configuration by sweeping the out-phasing angle for different duty-cycles, and monitoring phase and efficiency as function of the out-phasing angle.

As mentioned above, in a further development, the combination circuit can be configured in step S300 as a non-coherent combiner by having first and second reactive inductive components of the combination circuit with different values. Alternatively, the value of an additional, third reactive element connected parallel to one of the first and second amplification device outputs may be adapted such that the combination circuit is configured for non-coherent combining. The required effective values of the first and second reactive inductive components are found by sweeping the out-phasing angle for different duty-cycles and values for the third reactive element, and choosing the best efficiency as function of out-phasing angle for given output power back-off level.

As a further alternative or additional to step S300, in a step S400 a respective first and second duty-cycle is adapted for the respective first and second amplification devices to different values by sweeping the out-phasing angle for different duty-cycles.

Summarizing, a method for setup of parameter values in a RF power amplifier circuit arrangement has been disclosed. The amplifier circuit arrangement, basically, comprises a first and a second amplification branch and is operated in an out-phasing configuration for amplification of RF input signals with modulated amplitude and modulated phase. Also several respective circuit arrangements have been disclosed. According to a first aspect a re-optimization of the dead-time or conversely the duty-cycle, respectively, the phase of the output signal after the combiner can be kept linear with respect to the out-phasing angle. Further, according to a second aspect, additionally to introduction of an optimally chosen dead-time a non-coherent combiner can reduce crowbar current and switching losses due the output capacitance. Furthermore, according to a third aspect the reactive compensation can, additionally or alternatively, be controlled by operating both the amplification branches at different duty-cycles.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. Method for setting up a RF power amplifier circuit arrangement for amplification of RF input signals with modulated amplitude and modulated phase,
    wherein the circuit includes first and second amplification branches each having an input and an output, for amplifying one of a first and a second component signal of which only the phase is modulated, and a combination of which corresponding to the RF input signal;
    wherein in each of the first and second amplification branches, respective first and second amplification devices are configured to operate in a switching-mode with a respective duty-cycle; and
    wherein a combination circuit is configured to combine the outputs of the first and second amplification branches such that the circuit arrangement is arranged for operating in an out-phasing configuration;
    the method comprising:
    setting values of first and second reactive inductive components of the combination circuit connected to respective first and second amplification device outputs of the respective first and second amplification devices, in accordance with a criteria of zero-voltage switching for each of the first and second amplification devices as a separate component; and
    adjusting the first and second duty-cycles for operating the first and second switching-mode amplification devices in accordance with a criteria of a constant phase of the output signal of the circuit arrangement with respect to an out-phasing angle of an out-phasing configuration by sweeping the out-phasing angle for different duty-cycles, and monitoring phase and efficiency as a function of the out-phasing angle.

2. Method according to claim 1, further comprising configuring the combination circuit as a non-coherent combiner by one of having correspondingly different values for the first and the second reactive inductive components and by adapting a third reactive element connected parallel to one of the first and second amplification device outputs, such that the combination circuit is configured for non-coherent combining, by sweeping the out-phasing angle for different duty-cycles and values for the third reactive element, and choosing a best efficiency as a function of the out-phasing angle for a given output power back-off level.

3. Method according to claim 1, further comprising setting of a respective first and second duty-cycle for the respective first and second amplification devices to different values by sweeping the out-phasing angle for different duty-cycles.

4. A RF power amplifier circuit arrangement for amplification of RF input signals with modulated amplitude and modulated phase, the circuit arrangement comprising:
    first and second amplification branches each having an input and an output and being configured for amplifying one of a first and a second component signals of which only a phase is modulated, a combination of which corresponding to the RF input signal;
    in each of the first and second amplification branches, respective first and second amplification devices configured to be operative in a switching-mode, wherein each amplification branch has a respective first and a second duty-cycle;
    wherein the outputs of the first and second amplification branches are combined by a combination circuit such that the circuit arrangement is operative in an out-phasing configuration;
    wherein respective first and second reactive inductive components are connected to the respective output of the first and second amplification devices; and
    wherein the first and second duty-cycles for operating the first and second switching-mode amplification devices are different.

5. RF power amplifier circuit arrangement for amplification of RF input signals with modulated amplitude and modulated phase, comprising:
    first and second amplification branches each having an input and an output, for amplifying one of a first and a second component signals of which only the phase is modulated, and a combination of which corresponding to the RF input signal;
    wherein in each of the first and second amplification branches, respective first and second amplification devices are configured to operate in a switching-mode with a respective first and second duty-cycle; and
    wherein a combination circuit is configured to combine the outputs of the first and the second amplification branches such that operating the circuit arrangement in an out-phasing configuration;
    wherein values of first and second reactive inductive components of the combination circuit connected to respective first and second amplification device outputs of the respective first and second amplification devices, and the first and second duty-cycles for operating the first and second switching-mode amplification devices are obtained by the method in accordance with claim 1.

6. RF power amplifier circuit arrangement according to claim 5, wherein the combination circuit is configured as a non-coherent combiner by one of a third reactive element connected in parallel to one of the first and the second amplification device outputs and by having correspondingly different values for the first and the second reactive inductive components; and wherein a value of the duty-cycles and one of the value of the third reactive element and the corresponding different values for the first and the second reactive inductive components are obtained by the method in accordance with claim 2.

7. Circuit arrangement according to claim 5, wherein the first and second duty-cycles for operating the first and second switching-mode amplification devices are identical.

8. Circuit arrangement according to claim 4, wherein the first and second amplification devices comprise a circuit configuration to be operative as switching-mode power amplifiers in one of class-D, class-DE, class-E, class-F, or class-E/F mode.

9. Circuit arrangement according to claim 4, wherein the combination circuit comprises a transmission-line transformer for combining the outputs of the first and second amplification branches.

10. Circuit arrangement according to claim 4, wherein the combination circuit comprises a centre-tapped differential inductor for combining the outputs of the first and second amplification branches.

11. Circuit arrangement according to claim 4, wherein the combination circuit comprises one of a λ/4-transmission line combiner and a lumped equivalent thereof for combining the outputs of the first and second amplification branches.

12. Circuit arrangement according to claim 4, wherein the combination circuit comprises a respective first and a second transformer, of which a respective primary winding is connected with the respective outputs of the first and second amplification branches and the respective secondary windings are stacked in series for combining the outputs of the first and second amplification branches.

13. Circuit arrangement according to claim 4, wherein the combination circuit comprises a respective first and a second lattice balun, of which the respective inputs are connected to the respective outputs of the first and second amplification branches and the outputs of the first and the second lattice baluns are connected in parallel to the load.

14. A transmitter comprising a circuit arrangement according to claim 4 for a system in which wide-band complex envelope signals are processed, including EDGE, UMTS using WCDMA modulation, HSxPA, WiMAX using OFDM modulation, and 3G-LTE using OFDM modulation.

\* \* \* \* \*